United States Patent [19]

Yano et al.

[11] Patent Number: 5,041,892

[45] Date of Patent: * Aug. 20, 1991

[54] HOMO-JUNCTION BIPOLAR TRANSISTOR HAVING HIGH BASE CONCENTRATION AND SUITABLE FOR LOW TEMPERATURE OPERATION

[75] Inventors: Kazuo Yano, Koganei; Masaaki Aoki; Toshiaki Masuhara, both of Tokyo; Katsuhiro Shimohigashi, Musashimurayama, all of Japan

[73] Assignee: Hitachi, Ltd., Tokyo, Japan

[*] Notice: The portion of the term of this patent subsequent to Aug. 14, 2007 has been disclaimed.

[21] Appl. No.: 522,826

[22] Filed: May 14, 1990

Related U.S. Application Data

[63] Continuation of Ser. No. 253,228, Oct. 4, 1988, Pat. No. 4,949,145.

[30] Foreign Application Priority Data

Oct. 7, 1987 [JP] Japan .................................. 62-251491
Jun. 10, 1988 [JP] Japan .................................. 63-141702
Aug. 12, 1988 [JP] Japan .................................. 63-199834

[51] Int. Cl.$^5$ ............................................ H01L 29/72
[52] U.S. Cl. ........................................ 357/34; 357/20; 357/40; 357/49; 357/55; 357/81; 357/83; 357/87; 357/90; 357/42; 357/43
[58] Field of Search ...................... 357/34, 20, 40, 42, 357/43, 49, 55, 81, 83, 89, 90

[56] References Cited

U.S. PATENT DOCUMENTS 4,178,190 12/1979 Polinsky .
4,949,145 8/1990 Yano et al. ............................. 357/34

FOREIGN PATENT DOCUMENTS 190758 8/1987 Japan .

OTHER PUBLICATIONS

"Very High Speed Bipolar Devices", Baifukan, pp. 80-81, (1985).
"Technical Digest 1974 International Electron Devices Meeting", pp. 262-265.
"IEEE Transactions on Electron Devices", vol. Ed-34, No. 1, pp. 139-142, (1987).
"IEEE Transactions on Electron Devices", vol. Ed-27, No. 3, pp. 563-257, (1980).
"Appl. Phys. Letter", vol. 45, No. 10, pp. 1086-1088 (1984).
"IEEE Transactions on Electron Devices", vol. Ed-15, No. 10, pp. 732-735 (1968).
"Very High Speed Compound Semiconductor Device", Baifukan, pp. 105-109 (1986).
"Tech. Digest 1978 Int'l. Electron Devices Meeting", pp. 316-319.
"Tech. Digest 1986 Int'l. Electron Devices Meeting", pp. 24-27.
"Physics of Semiconductor Devices", S. M. Sze, 2nd Edition, pp. 140-147 (1981).

Primary Examiner—Edward J. Wojciechowicz
Attorney, Agent, or Firm—Kenyon & Kenyon

[57] ABSTRACT

In a homo-junction bipolar transistor suitable for a low temperature operation below 200 K. (particularly below 77 K.), the maximum value of the impurity concentration of an intrinsic base region is set to be at least $1 \times 10^{18}/cm^3$ and the impurity concentration of an emitter region is set to a value lower than this maximum value. Thus, a base resistance can be reduced and a high speed operation becomes possible. Furthermore, bandgap narrowing develops in the intrinsic base region and a common-emitter current gain in the low temperature operation can be kept at a sufficient value. When this homo-junction bipolar transistor is formed together with complementary insulated gate field effect transistors on the surface of a semiconductor substrate, there can be obtained a Bi-CMOS device capable of a high speed operation even in the low temperature operation.

7 Claims, 20 Drawing Sheets

HOMO-JUNCTION BIPOLAR TRANSISTOR HAVING HIGH BASE CONCENTRATION AND SUITABLE FOR LOW TEMPERATURE OPERATION

This application is a continuation of application Ser. No. 253,228, filed Oct. 4, 1988, now U.S. Pat. No. 4,949,145.

BACKGROUND OF THE INVENTION

This invention relates to a semiconductor apparatus containing at least a bipolar transistor and more particularly to a semiconductor apparatus having a sufficiently great current gain at a low temperature, too, and capable of a high speed operation.

Hereinafter, a description will be given about an npn bipolar transistor by way of example. FIGS. 2(A) and (B) of the accompanying drawings are a sectional view of a conventional npn bipolar transistor and an impurity distribution along line a - a' shown on pages 80 and 81 of "Very High Speed Bipolar Devices" (published by Baifukan, 1985). In the drawings, reference numeral 1 represents an n-type emitter region; 2 is a p-type intrinsic base region; 3 is a p-type extrinsic base region; 4 is an n-type low concentration collector region; 5, is an n-type high concentration collector region; 6 is a thick SiO film for isolation; 8 is a p-type Si substrate; and 10 is a high concentration p-type region as a channel stopper.

Here, the intrinsic base region 2 represents a portion of the p-type base regions 2, 3 functioning as a path through which the electrons injected from the emitter flow out to the collector and the extrinsic base region 3 represents a portion of the p-type base region other than the intrinsic base region 2.

In FIG. 2(B), reference numeral 12 represents the concentration distribution of an n-type impurity and 13 represents the concentration distribution of a p-type impurity. As shown in the diagram, the conventional bipolar transistor uses an impurity region having a high concentration of higher than $1 \times 10^{20}/cm^3$ as the emitter 1. The intrinsic base region 2 is composed of a p-type region having a lower impurity concentration than the emitter 1. As illustrated in this example the value is set ordinarily to $1 \times 10^{18}/cm^3$ or below.

The conventional bipolar transistor described above operates normally at room temperature but involves the problem in that its current gain drops remarkably at a low temperature of 200° K. or below. FIG. 3 shows the temperature dependence of the common-emitter current gain according to an actual measurement. Line $l_1$ represents the temperature dependence of the current gain of the conventional structure shown in FIG. 2. The current gain which is about 150 at room temperature drops to 1 or below at 100° K.

FIG. 4(A) is a sectional view of the bipolar transistor discussed by H. Yagi et al. in "Technical Digest 1974 International Electron Devices Meeting", p.p. 262–265. FIG. 4(B) shows the impurity distribution on the section b - b'. As discussed in this reference, the current gain generally becomes smaller with a lower emitter concentration. However, if the thickness of the low concentration emitter region 9 is smaller than the diffusion length of a positive hole, a sufficiently large current gain can be observed at room temperature even in such a structure wherein the impurity concentration of the emitter region is lower than that of the intrinsic base region However, this structure, too, involves the problem that the current gain drops remarkably at low temperature in the same way as in the structure shown in FIG. 2. Line $l_2$ in FIG. 3 represents the actually measured value of the current gain of the bipolar transistor having the structure shown in FIG. 4. Whereas the current gain is about 100 at room temperature, it drops to about 4 at 90° K.

In order to avoid the remarkable drop of the current gain of the bipolar transistor in the low temperature operation, IEEE, Trans. Electron Devices, ED-34 (1987), pp. 139–142 discusses a method which sets the emitter concentration to $1 \times 10^{19}/cm^3$ or below. However, this reference does not at all disclose a definite structure. When the inventors of the present invention actually measured a bipolar transistor shown in FIG. 5 and having an emitter concentration of $5 \times 10^{18}/cm^3$ and a base concentration of $1 \times 10^{18}/cm^3$, it was found that a sufficiently large current gain could also not be obtained at low temperature in accordance with this structure. This result is represented by line $l_3$ in FIG. 3. When compared with the structures shown in FIGS. 2 and 4(A), only a current gain of as small as 10 or below could be obtained at low temperature of 100° K. or below, though temperature dependence of the current gain dropped.

The bipolar transistor structure in accordance with another prior art technique is discussed in IEEE, Trans. Electron Devices, ED-27 (1987), pp. 563–570. It is a bipolar transistor having a high impurity concentration intr±nsic base region According to the result described in this reference, however, the current gain which is 150 at room temperature drops to 16 to 30 at 77° K. in a device having a maximum base concentration of $2.5 \times 10^{18}/cm^3$. Since both the emitter region and base region have a high concentration impurity in the structure of this reference, the device involves a problem in that its emitter-base junction breakdown voltage is low Still another method of improving the current gain in the low temperature operation is described in Appl. Phys. Lett., vol. 45 (1984), pp. 1086–1088. From this reference a method of forming a hetero-junction between the emitter and base by using AlGaAs for the emitter and GaAs for the base is well known in the art. However, the formation of such a hetero-junction is not only difficult from the aspect of production technique but is also time-consuming and expensive to produce. Since different kinds of materials are bonded between the emitter and the base, the device is not free from the problem that recombination of carriers is likely to occur on the interface.

On the other hand, the reason why the bipolar transistor exhibits only an extremely low current gain at low temperature in accordance with the prior art technique is explained in IEEE, Trans. Electron Devices, ED-15 (1968), pp. 732–735. Namely, since the impurity of the emitter 1 contains an impurity having a high impurity concentration of $1 \times 10^{19}/cm^3$ or more, the bandgap of the emitter region is smaller than that of the intrinsic base region. This will be explained elsewhere in further detail.

On the other hand, "Very High Speed Compound Semiconductor Devices" (published by Baifukan, 1986) states on page 108 as follows:

"HBT having a small base-emitter capacitance can be accomplished by setting the relation $N_E \leq 10^{18}/cm^{-3}$, $P_B \geq 10^{19}/cm^{-3}$, which is impossible by the homo-junction, to reduce the base resistance."

(Here, $N_E$ and $P_B$ represent the impurity concentrations of the emitter and the base, respectively, and HBT represents a hetero-junction bipolar transistor.) As can be understood from this statement, it has been believed conventionally that if the transistor having the homo-junction (junction by the same material) between its emitter and base such as the transistor of the present invention has a concentration distribution such as the distribution of the present invention, the transistor has low injection efficiency at normal temperature and a low current gain and is therefore not much practical.

On the other hand, Japanese Patent Laid-Open No. 190758/1987 proposes a homo-junction type bipolar transistor causing a bandgap difference between the emitter region and the base region by making the base impurity concentration incomparably greater than the emitter impurity concentration, that is, by setting the base impurity concentration to at least $2 \times 10^{20}/cm^3$, in order to avoid the drop of the current gain, to reduce the base resistance and thus to improve the operation speed.

However, the bandgap narrowing value $\Delta Eg$ of the silicon semiconductor by the high impurity concentration $N_A$ disclosed in the reference described above [i.e. $\Delta Eg = 22.5 \ (N_A/10^{18})^{\frac{1}{2}}$; (meV)] is the value at room temperature (approx. 300° K.) as can be understood from the formula proposed by p. D. Lanyon et al. in Technical Digest 1978 International Electron Devices Meeting, pp. 316–319.

However, this reference does not mention the problem of the low temperature operation below 200° K. of the homo-junction bipolar transistor Moreover, the bandgap narrowing value $\Delta Eg$ is much greaxer than the value that is commonly believed at present (refer to the formula on page 27 and FIG. 9, S. E. Swirhun et al., Technical Digest 1986 International Electron Devices Meeting, pp. 24–27) and as a result, the common-emitter current gain of the bipolar transistor is also an overestimated value. As a result of studies, the inventors of the present invention found that if the value which was commonly believed was employed, the common-emitter current gain having a sufficiently large value could not be obtained.

On the other hand, since the impurity concentration of the intrinsic base region in the reference described above is an extremely large value of above $2 \times 10^{20}/cm^3$, it was found as a result of studies by the present inventors that the reference did not consider the effect of remarkable drop of the common-emitter current gain due to Auger recombination.

SUMMARY OF THE INVENTION

None of the prior art technique described above are free from the problems that the current gain drops in the low temperature operation and to avoid this problem, great difficulty is encountered in the fabrication technique. In other words, a bipolar transistor structure which has a practically sufficient current gain at a low temperature below 200° K. and which can be practiced easily is not yet known in the art.

It is therefore an object of the present invention to provide a homo-junction bipolar transistor which has a practically sufficient current gain in low temperature operation and operates at a high speed.

An aspect of a preferred embodiment of the present invention for solving the problems with the prior art technique is that the maximum value of the impurity concentration of the intrinsic base region of the bipolar transistor is at least $1 \times 10^{18}/cm^3$, a region having a lower impurity concentration than the maximum value of the intrinsic base region is formed at at least part of the emitter region and the junction between the base and the emitter is made of the same material or substantially the same material with the exception that only the impurity contents are different. Here, the term "substantially the same material" means those materials whose bandgaps are substantially equal to one another, such as crystalline silicon and polycrystalline silicon.

Since the base and the emitter are made of the same material or substantially the same material such as single crystal silicon, polycrystalline silicon or amorphous silicon as described above, the base-emitter junction becomes the homo-junction and difficulty in the fabrication technique can be reduced.

Since the intrinsic base region has a high impurity concentration, the base comes to be a narrow bandgap and since the emitter region has a low impurity concentration, the emitter comes to be a wide bandgap. Thus, the present invention accomplishes a high current gain at low temperature by using the structure which has been believed impractical in the past.

The present invention obtains a high current gain by positively operating a device at low temperature which has thus been believed impossible conventionally, and is a revolutionary invention with respect to simplification of the fabrication process and to improvement in device characteristics.

As is well known, a low temperature operation is effective for making an MOS device highly mobile and making it operate at a high speed. Therefore, a homo-junction bipolar device exhibiting its high performance at a low temperature has been desired in order to improve the performance of Bi-CMOS (one chip having mounted thereto bipolar and CMOS) devices In this respect, too, the present invention has high utility.

As described already, the reason why the bipolar transistors shown in FIGS. 2 and 4 in accordance with the prior art technique exhibit only an extremely low current gain at low temperature is explained in IEEE, Trans. Electron Devices, ED-15 (1968), pp. 732–735. In other words, since the emitter 1 contains an impurity in a concentration as high as at least $1 \times 10^{19}/cm^3$, the bandgap of the emitter region is smaller than the bandgap of the intrinsic base region. Incidentally, the bandgap narrowing with the increase in the impurity concentration is explained in detail on page 144 of S. M. Sze, "Physics of Semiconductor Devices", second edition, 1981. This will be explained with reference to a band diagram shown in FIG. 6. The bandgap exists between a conduction band 20 and a valence band 21 but when the bandgap 14 of the emitter region is smaller than the bandgap 15 of the intrinsic base region, the effect of an energy barrier 17 acting on the electrons 16 (in the case of an NPN transistor; or positive holes in the case of a PNP transistor) injected from the emitter to the base is greater than the effect of the energy barrier 19 acting on the positive holes 18 injected from the base to the emitter so that the injection efficiency of electrons becomes smaller than that of the positive holes Due to this effect, the common-emitter current gain $h_{FE}$ is modulated as expressed by the formula below:

$$h_{FE} = h_{FE0} \exp{(\Delta Eg/kT)} \qquad (1)$$

where $h_{FEO}$ is the current gain when the bandgap narrow effect described above does not exist, $\Delta E_g$ is the bandgap difference $E_{ge} - E_{gb}$ between the bandgap $E_{ge}$ at the emitter and the bandgap $E_{gb}$ at the base, k is a Boltzmann constant and T is an absolute temperature In the conventional bipolar transistor which uses the same kind of material for the emitter-base junction, $\Delta E_g$ is always negative so that the current gain drops due to the bandgap narrowing effect in this emitter region. Moreover, as is obvious from the formula (1), the bandgap narrowing effect at the emitter becomes more remarkable with a decreasing temperature T and the current gain of the conventional bipolar transistor drops remarkably with the temperature drop. Incidentally, the $\Delta E_g$ value varies with the impurity concentration in the semiconductor and is from about 10 to about 200 meV when the impurity concentration is above $1 \times 10^{18}/cm^3$.

In comparison with the prior art technique, the present invention forms the intrinsic base region so that its impurity concentration is at least $1 \times 10^{18}/cm^3$. For this reason, the bandgap is small in the intrinsic base region.

In contrast, since the emitter region has a lower impurity concentration than the intrinsic base region, the bandgap narrowing effect is smaller than that of the intrinsic base region. Therefore, unlike the conventional bipolar transistors, $\Delta E_g$ is positive in the bipolar transistor in accordance with the present invention. As shown in FIG. 7, in the bipolar transistor of the present invention, the energy barrier 17 acting on the electrons 16 injected from the emitter to the base is smaller than the energy barrier 19 acting on the positive holes 18 injected from the base to the emitter and hence the injection efficiency of the electrons is extremely high. The inventors of the present invention fabricated tentatively the bipolar transistor of the present invention and evaluated its performance and found out that the common-emitter current gain increased with the temperature drop as represented by line $l_4$ in FIG. 3. This result provides for the first time a method which can easily accomplish a bipolar transistor having a practically and sufficiently high current gain at 77° K.

In the aforementioned formula (1), the following formula can be used for rough estimation of $h_{FEO}$:

$$h_{FEO} \sim N_E/N_B \quad (2)$$

where $N_E$ and $N_B$ are impurity concentration in the emitter region and in the base region near the emitter-base junction, respectively.

FIGS. 8 to 11 show the result of calculation of hFE by use of the formulas (1) and (2). FIGS. 8 to 11 show the results of calculation at 300° K., at 200° K., at 150° K. and at 77° K. respectively. In the diagrams the abscissa represents the emitter impurity concentration and the ordinate does the base impurity concentration. A contour $h_{FE}$ line is also shown in the drawings. In order for the bipplar transistor to have at least the current gain, the common-emitter current gain must be at least 1. In FIGS. 8 to 11 the regions or areas where $h_{FE}$ is at least 1 are represented by oblique lines. As is obvious from FIG. 8, as the regions which satisfy the condition $h_{FE} > 1$ at 300° K. (room temperature), there are a known usable region I where the emitter impurity concentration is set to be higher than the intrinsic base impurity concentration and a usable region II where the latter is higher than the former. The usable region II in FIG. 8 corresponds substantially to the technical content disclosed in the afore-mentioned reference, Japanese Patent Laid-Open No. 190758/1987

In this usable region II in FIG. 8, however, the inventors of the present invention clarified that the common-emitter current gain $h_{FE}$ having such a great value (at least about 30) as disclosed in the drawing of Japanese Patent Laid-Open No. 190758/1977 but only the common-emitter current gain of an extremely insufficient value, i.e. $1 < h_{FE} < 3.16$ could be obtained. This reason results from the fact that the Laid-Open Patent described above uses a by far greater value than the value which is believed reasonable at present as the bandgap narrowing value $\Delta E_g$.

In the same way as the two usable regions I and II in FIG. 8 (300° K.), there are two usable regions I and II in each of FIG. 9 (200° K.), FIG. 10 (150° K.) and FIG. 11 (77° K.).

As shown in particular in FIG. 11, in order to obtain $h_{FE}$ of at least 1 at 77° K., the following two methods can be employed.

(1) A method which sets the base impurity concentration to be at least $1 \times 10^{18}/cm^3$ and sets the emitter impurity concentration to be lower than the base impurity concentration (usable region II).

(2) A method which sets the base impurity concentration to be at most $1 \times 10^{18}/cm^3$ and sets the emitter impurity concentration to be higher than the base impurity concentration (usable region I).

According to the method (2) among these methods, since the base impurity concentration is low in this method (usable region I), punch-through is likely to occur in the base region and base resistance is high. Due to these problems, this method is not suitable for a high speed operation. Since the base impurity concentration is high by the method (1) (usable region I), it has a low base resistance and is suitable for a high speed operation. As can be seen clearly from FIGS. 8 and 11, the concentration region where $h_{FE}$ is at least 1 is entirely different between the room temperature and the low temperature of 77° K. However, this has not been known in the past.

FIG. 12 shows dependence of the common-emitter current gain on the base impurity of the bipolar transistor of the present invention at 77° K. Here, the emitter concentration $N_E$ is set to $1 \times 10^{18}/cm^3$ If the impurity concentration $N_B$ of the intrinsic base region is low as represented by solid line in the diagram, the common-emitter current gain $h_{FE}$ decreases with the increase in the impurity concentration $N_B$ of the intrinsic base region. For, $h_{FEO}$ in the afore-mentioned formula (1) decreases, and this is well known for long. However, when the impurity concentration $N_{B3}$ of the intrinsic base region exceeds $1 \times 10^{18}/cm^3$, the current gain $h_{FE}$ increases drastically with the increase in the base concentration. This is because at a concentration of $1 \times 10^{18}/cm^3$ or more, the bandgap narrowing effect of the intrinsic base region becomes remarkable so that the factor $\exp(\Delta E_g/kT)$ in the formula (1) increases drastically. The increase in the current gain $h_{FE}$ at the low temperature of 77° K. occurs extremely drastically and contains a qualitatively novel operation mechanism which can never be anticipated by extrapolation or analogy of the measured values of the transistor characteristics in accordance with prior art techniques.

The afore-mentioned structure of FIG. 4, which is proposed by H. Yagi et al., is somewhat analogous to the present invention in that the emitter impurity concentration is lower than the concentration of the intrinsic base region at the emitter-base junction but is obviously different from the present invention in structure because H. Yagi et al. use a low concentration value of $9 \times 10^{16}/cm^3$ as the concentration of the intrinsic base region.

Bipolar transistors of the type wherein the impurity concentration of the emitter region is lower than that of the intrinsic base region have already been attempted in bipolar transistors having a hetero-junction between the base and the emitter. As described already, the aforementioned reference "Very High Speed Compound Semiconductor Devices" describes "HBT having a small base-emitter capacitance can be accomplished by setting the relation $N_E \leq 10^{18}/cm^3$, $P_B \geq 10^{19}$ $cm^{-3}$, which is impossible by the homo-junction, to reduce the base resistance."

(Here, $N_B$ and $P_B$ are impurity concentration of the emitter and the base, respectively, and HBT is a hetero-junction bipolar transistor).

As can be understood from the description cited above, it has been the conventional concept that if the transistor having the homo-junction (junction by the same material) between the emitter and the base such as the transistor of the present invention has a concentration distribution such as the distribution of the present invention, the current gain will be too small for practical application. In other words, the transistor has been expected to exhibit the characteristics such as the dash lines in FIG. 12.

The lower limit value of the impurity concentration of the emitter region can be determined by the following method.

As shown in FIG. 13(A), the low impurity concentration emitter layer 9 exists near the emitter-base junction in the structure of the present invention but a high concentration emitter region 1 of at least $5 \times 10^{19}/cm^3$ must be provided in order to reduce the contact resistance in the emitter region near the junction of a metal-semiconductor for extending the emitter electrode 22. However, if the concentration of the low concentration emitter region 9 is too low, the depletion region 23 between the emitter and the base reaches the portion near the high concentration emitter region 1. As a result, the current gain drops due to the bandgap narrowing in the high concentration emitter region 1 in the transistor characteristics. This problem can be solved by making the width $W_{dep}$ of the depletion region 23 smaller than the depth W of the low concentration emitter region 9. More definitely, it is preferred that the width $W_{dep}$ of the depletion region is below 1/5 of the depth W of the low concentration polycrystalline silicon emitter region 9. The width $W_{dep}$ of the depletion region is given by the following formula:

$$W_{dep} = \sqrt{\frac{2\epsilon(V_{bi} - V_{BE})}{q \cdot N_E}} \quad (3)$$

where $\epsilon$ is a dielectric constant of the semiconductor, conductor, $V_{bi}$ is a built-in voltage between the base and the emitter, $V_{BE}$ is a base-emitter voltage, q is an electric charge of an electron, and $N_E$ is the impurity concentration of the low concentration emitter 9.

In view of the fact that $V_{bi} - V_{BE}$ is about 0.1 V under the operating condition, the concentration $N_E$ of the low concentration emitter 9 must satisfy the following inequality in the $1/cm^3$ unit $$N_E > \frac{5\epsilon}{qW^2} \quad (4)$$

Here, $\epsilon$ is given in the unit of F/cm, q is $1.6 \times 10^{-19}$ and W is given by cm. Incidentally, the formula (4) can be applied similarly to the structure such as shown in FIG. 13(B). In FIG. 13(B), the structure of the present invention is shown formed by laminating a low concentration emitter region 46 and a high concentration emitter region 47 made of polycrystalline silicon, amorphous silicon or recrystallized silicon of them on an Si substrate.

The bipolar transistor of the present invention has a practical and sufficient large current gain at a temperature below 200° K. It is capable of a high speed operation because of its characteristics that the base resistance is small since the impurity concentration of the intrinsic base region is high and the junction capacitance between the emitter and the base is small since the impurity concentration of the emitter is low. These excellent characteristics can be obtained by a simple fabrication technique.

When a bipolar transistor is operated at low temperature, transconductance $g_m$ as the index of current driving ability becomes great As is well known, $g_m$ is given by the following formula:

$$g_m = \frac{qI_c}{kT} \quad (5)$$

where q is an electric charge of an electron, k is the Boltzmann constant, T is an absolute temperature and $I_c$ is a collector current. It is obvious from this formula that when the temperature T is smaller, transconductance $g_m$ becomes greater. Since it is possible in accordance with the present invention to obtain a bipolar transistor which can operate at low temperature of below 200° K. with a practically sufficient current gain, a high performanc bipolar transistor which exhibits high current driving ability at low temperature can be accomplished.

Figure 1A:
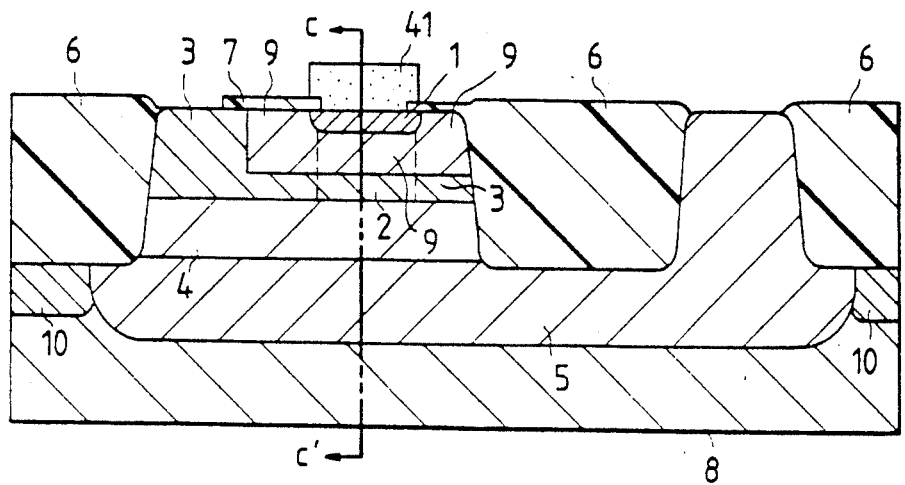
FIGS. 1(A) and (B) are a sectional view of an npn bipolar transistor in accordance with a first embodiment of the present invention and a diagram showing its impurity distribution along line c - c'.

In the drawings, reference numerals represent the following members, respectively:

1 n-type high impurity concentration emitter region,
2 P-type intrinsic base region,
3 P-type extrinsic base region,
4 n-type low impurity concentration collector region,
5 n-type high impurity concentration collector region,
6 SiO$_2$ film,
8 p-type Si substrate,
9 n-type low impurity concentration emitter region,
10 p-type channel stopper region,
11 p-type polycrystalline silicon base region,
12 distribution of n-type impurity concentration,
13 distribution of p-type impurity concentration,
14 bandgap of emitter region,
15 bandgap of intrinsic base region,
16 electron,
17 potential barrier against electrons injected from emitter to base,
18 positive hole,
19 potential barrier against positive holes injected from base to emitter,
20 conduction band of semiconductor,
21 valence band of semiconductor,
22 emitter electrode,
22 metal electrode having work function of below 4.6 eV,
23 width of depletion region between base and emitter,
24 base-emitter tunnel insulating film,
25 n-channel insulated gate field effect transistor,
28 gate electrode,
26 n-type high impurity concentration source region,
27 n-type high impurity concentration drain region,
29 gate insulating film,
30 p-type well region,
31 p-channel insulated gate field effect transistor,
32 p-type high impurity concentration source region,
33 p-type high impurity concentration drain region,
36 n-type well region,
37 p-type high impurity concentration region,
38 n-type high impurity concentration region,
39 transition metal or transition-metal. compound region,
40 SiO$_2$ region,
41 n-type high impurity concentration polycrystalline silicon region,
42 base electrode extension portion,
43 p-type low impurity concentration extrinsic base region,
44 n-type epitaxial growth single crystal region,
45 electrode,
46 low concentration n-type emitter region made of polycrystalline silicon, amorphous silicon or their recrystallized silicon,
47 high concentration n-type emitter region made of polycrystalline silicon, amorphous silicon or their recrystallized silicon,
48 high concentration p-type base region made of polycrystalline silicon, amorphous silicon or their recrystallized silicon,
50 high impurity concentration polycrystalline silicon p-type region.

DESCRIPTION OF THE PRESENT INVENTION

Throughout all the embodiments which will be described in detail, a semiconductor substrate is cooled to a low operating temperature (e.g. 200° K., 150° K., 77° K.) below room temperature (300° K.) by a cooling device (which uses liquid helium, liquid nitrogen, liquid air, Freon gas, or the like) or a cooler using a solvey cycle, not shown in the drawing.

The term "semiconductor apparatus" used herein represents a device consisting of a semiconductor substrate in combination with a cooling device for cooling the semiconductor substrate to an operating temperature substantially below 200° K.

Embodiment 1:

FIGS. 1(A) and (B) are a sectional view of an npn silicon bipolar transistor in accordance with a first embodiment of the present invention and a diagram showing its impurity distribution along line C - C'. This embodiment uses silicon as the semiconductor substrate. In the drawing, reference numeral 1 represents an n-type silicon high impurity emitter region; 9 is an n-type silicon low impurity concentration emitter region; 2 is a p-type silicon intrinsic base region; 3 is an extrinsic base region to which p-type silicon is doped in a high impurity concentration; is an n-type silicon low impurity concentration collector region; 5 is an n-type silicon high impurity concentration collector region; 6 and 7 are SiO$_2$ films; is a p-type silicon substrate; and 10 is a p-type channel stopper region.

Here, the high impurity concentration emitter region 1 and the high impurity concentration collector region 5 are low resistance regions which are formed by implanting a known n-type impurity such as arsenic (As), phosphorus (P), antimony (Sb), etc., in a concentration of at least $1 \times 10^{19}/cm^3$. The low impurity concentration emitter region 9 is formed by known methods of forming imPurity regions such as ion implantation, thermal diffusion, epitaxial growth, CvD (Chemical Vapor Deposit±on), etc., by introducing an n-type impurity such as As, P, Sb, or the like, in a concentration lower than the maximum value of the p-type impurity in the intrinsic base region 2. To avoid the bandgap narrowing effect in the emitter region 9, the concentration of this low concentration emitter region 9 is preferably below $5 \times 10^{18}/cm^3$. The lower limit of this concentration value can be calculated in accordance with the formula (4). If the depth W of the low concentration region 9 is 0.3 μm, for example, the lower limit value must be at least $3.7 \times 10^{16}/cm^3$. To obtain a distinct effect of the low concentration emitter layer 9, the depletion region 23 is preferably about 1/5 of W.

Figure 1B:
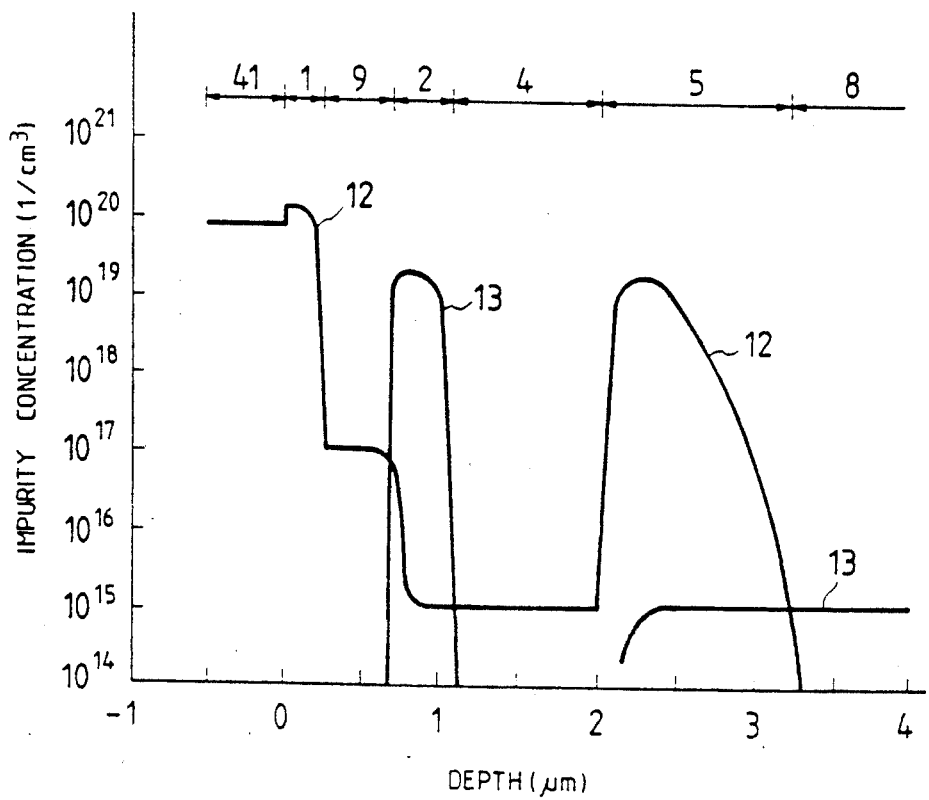

To avoid any adverse influences of the bandgap narrowing effect in the high impurity concentration region 1 on the operation characteristics of the transistor, the distance between the high impurity concentration emitter region 1 and the intrinsic base region 2 (that is, the width of the low impurity concentration emitter region 9) is preferably at least 0.1 μm. The p-type instrinsic base region 2 is formed by known methods of forming impurity regions such as ion implantation, thermal diffusion, epitaxial growth, etc., by use of a known p-type impurity such as boron (B). The maximum value of the impurity concentration of the p-type instrinsic base region 2 is at least $1 \times 10^{18}/cm^3$. As shown in FIG. 1(B), too, the impurity concentration distribution of the P-type intrinsic base region 2 is set so that the concentration decreases from the junction with the emitter 9 to the junction with the collector 4. By so doing a built-in electric field is formed in the base reg:on and the drifting speed of the electrons is accelerated in the base. Therefore, this arrangement is suitable for a high speed operation.

The n-type low impurity concentration collector region 4 is formed to have a lower concentration than the low impurity concentration emitter region 9 in order to reduce the junction capacitance between the base and the emitter.

In this embodiment the high impurity concentration emitter region 1 is formed by use of As in a concentration of $1 \times 10^{20}/cm^3$ while the low impurity concentration emitter 9 is formed by use of Sb in a concentration of about $8 \times 10^{17}/cm^3$ Sb has the advantage in that since its impurity level is low, it is not so easily affected by freeze-out of the carriers during a low temperature operation. This embodiment uses B as the impurity for the p-type intrinsic base region 2 and the maximum value of the impurity concentration is set to $3 \times 10^{19}/cm^3$ P is used as the impurity for the n-type low impurity concentration collector region 4 and the impurity concentration is set to $5 \times 10^{15}/cm^3$.

Figure 7:
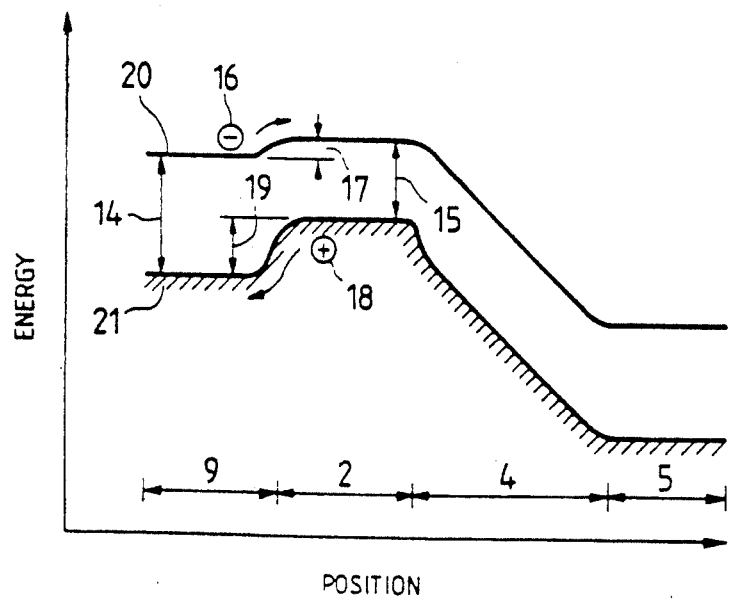
FIG. 7 is a diagram showing an energy band in the bipolar transistor of the present invention.

When the npn bipolar silicon transistor having the structure described above is operated, it operates at low temperature below 200° K. with a different operation mechanism from that of the conventional transistors because the bandgap in its intrinsic base region 2 is smaller than the bandgap in the low impurity concentration emitter region 9 ln other words, the present invention uses the repulsion effect by the potential barrier 19 in order to prevent the inverse-injection of the positive holes 18 from the base to the emitter as shown in FIG. 7. In contrast, the prior art technique uses the method which minimizes the inverse injection current by reducing the imPurity concentration below that of the emitter to reduce the positive hole density in the base. The effect of the potential barrier 19 on the positive holes becomes more remarkable below 200° K. and appears as a distinct difference of the optimum concentration regions shown in FIGS. 8 to 11. This is not yet known in the art. Therefore, the present invention can improve remarkably the injection efficiency of the electrons that are injected from the emitter to the base. For this reason, a practically sufficient current gain can be obtained even when the structure of this embodiment, wherein the impurity concentration of the intrinsic base region 2 is higher than that of the low concentration emitter region 9, is employed.

Figure 2A:
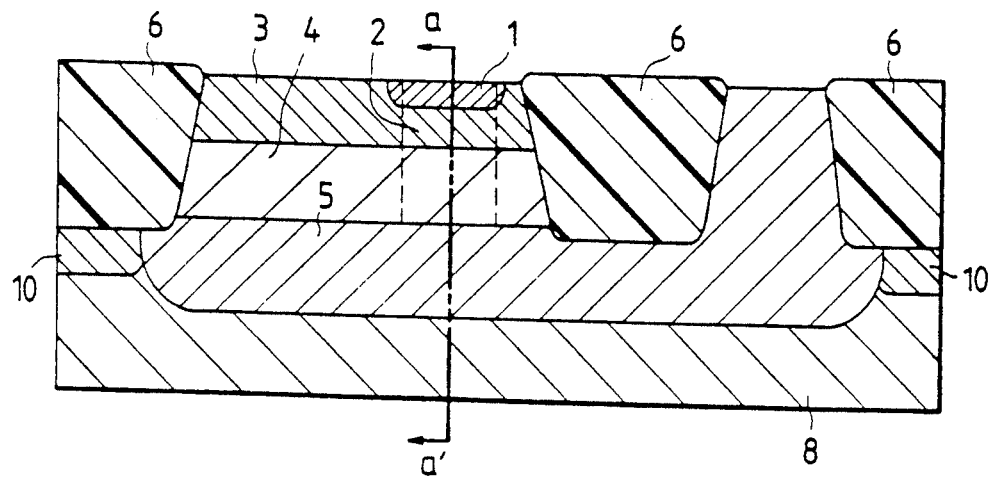
FIGS. 2(A) and (B) are a sectional view of a conventional npn bipolar transistor and its impurity distribution along line a - a'.
Figure 2B:
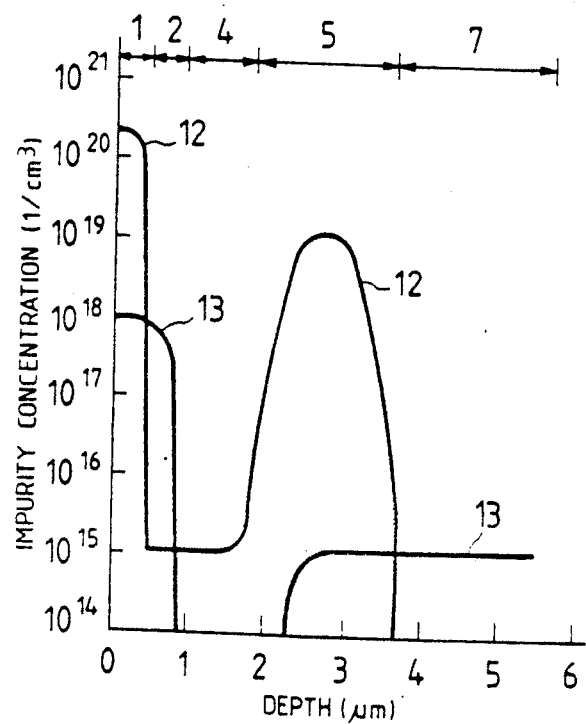
Figure 3:
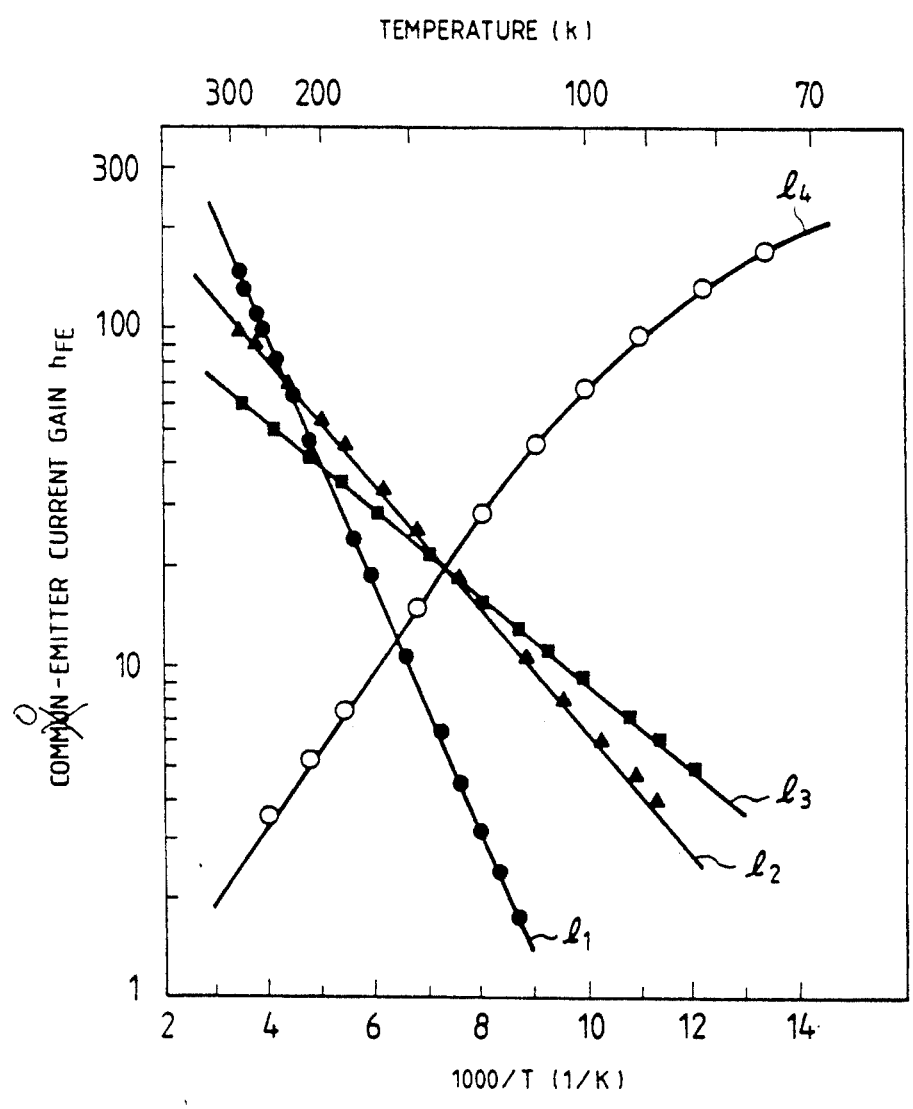
FIG. 3 is a diagram showing temperature dependence of a common-emitter current gain in the prior art device and in a device according to the present invention.
Figure 4:
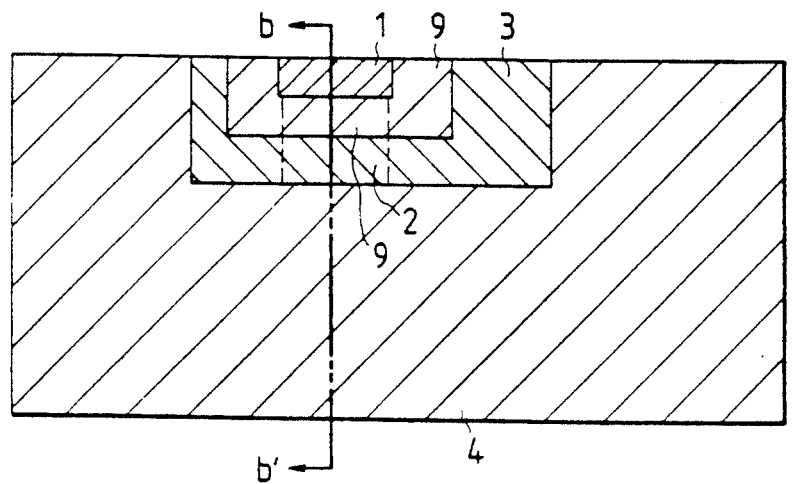
FIGS. 4(A) and (B) are a sectional view of a conventional npn bipolar transistor and a diagram showing its impurity distribution along line b - b'.
Figure 4:
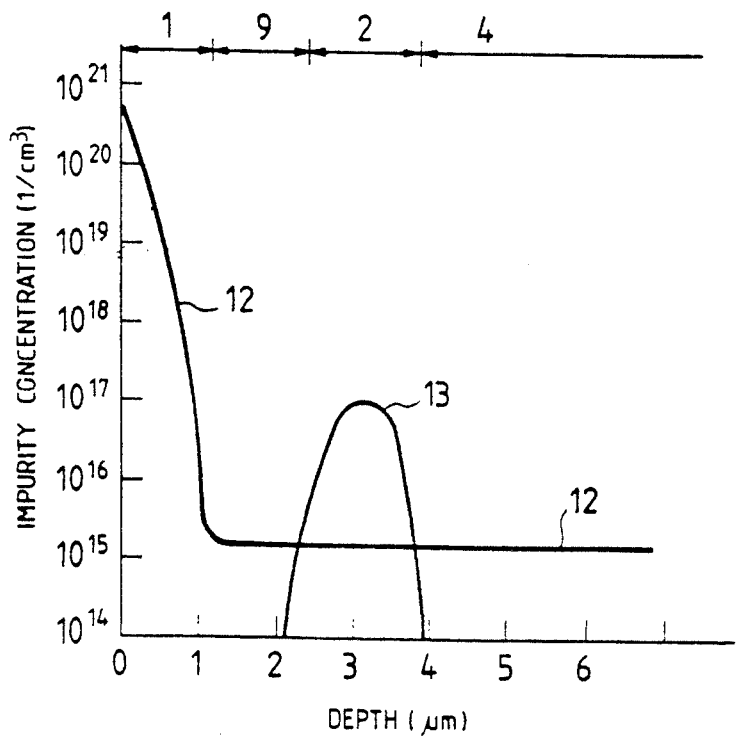
Figure 5:
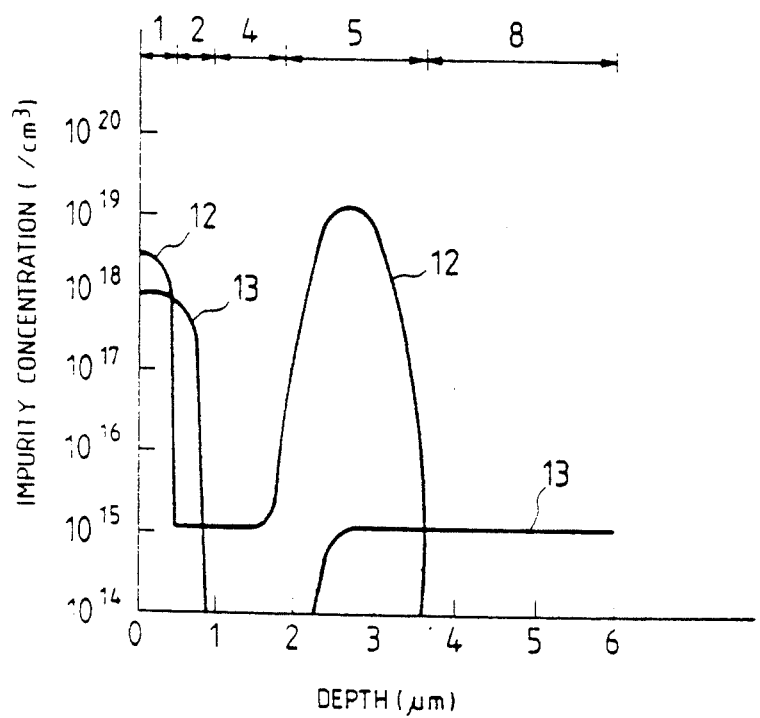
FIG. 5 is a diagram showing the impurity distribution on the section of the bipolar transistor examined by the present inventors before completion of the present invention.
Figure 6:
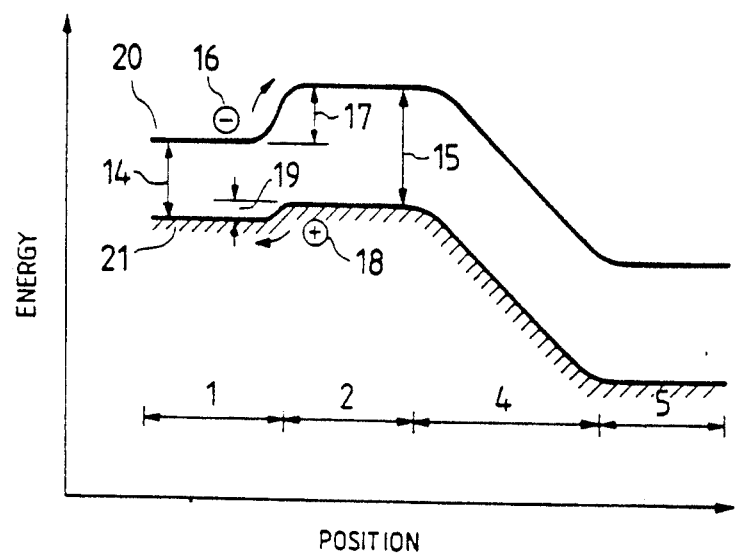
FIG. 6 is a diagram showing an energy band in a conventional bipolar transistor.

Since the impurity concentration of the intrinsic base region can be made higher than that of the bipolar transistor fabricated in accordance with the prior art technique shown in FIGS. 2 and 4, the bipolar transistor of the present invention has a smaller base resistance, is more excellent in high frequency characteristics and is suitable for a high speed operation. The base resistance value of below 1/10 of the conventional bipolar transistors can be accomplished so that the delay time of an ECL (emittercoupled logic) circuit using the bipolar transistor can be reduced down to 1/10. Since the concentration of the emitter region 9 is low, the junction capacitance between the emitter and the base is small and this is suitable for a high speed operation Furthermore, the emitter-base junction breakdown voltage can be improved. In addition, since the bipolar transistor of this embodiment can operate even in a low temperature tank of below 200° K., a bipolar transistor having extremely great transconductance can be obtained.

In accordance with this structure a barrier against positive holes is formed between the high concentration intrinsic base 2 and the low concentration collector region 4. Accordingly, injection of the positive holes into the low concentration collector is extremely less even under the forward bias state between the base and the collector, that is, in a saturation operation. Therefore, the transistor of this embodiment operates at a high speed even in a saturation operation during the low temperature operation.

Figure 14:
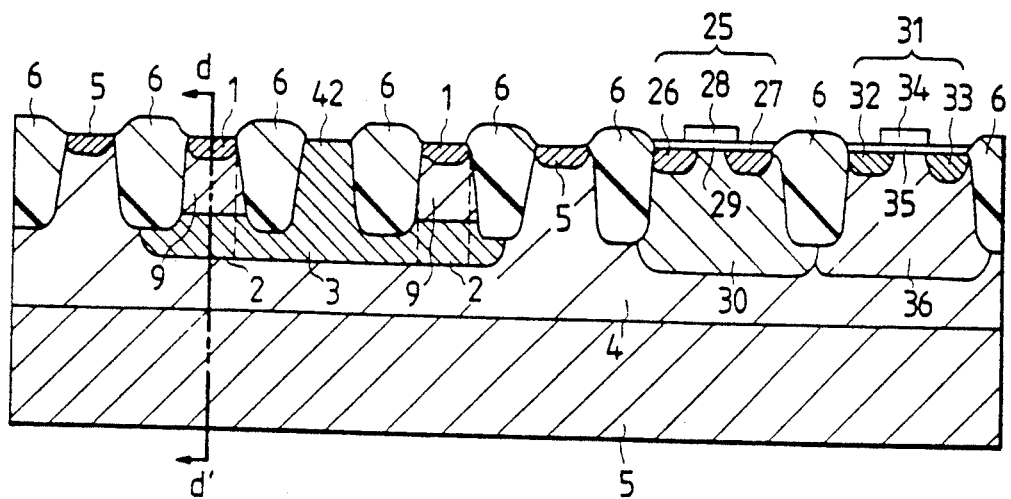
FIGS. 14(A) and (B) are a sectional view of an npn bipolar transistor and a CMOS device in accordance with a second embodiment of the present invention and a diagram showing their impurity distribution.
Figure 14:
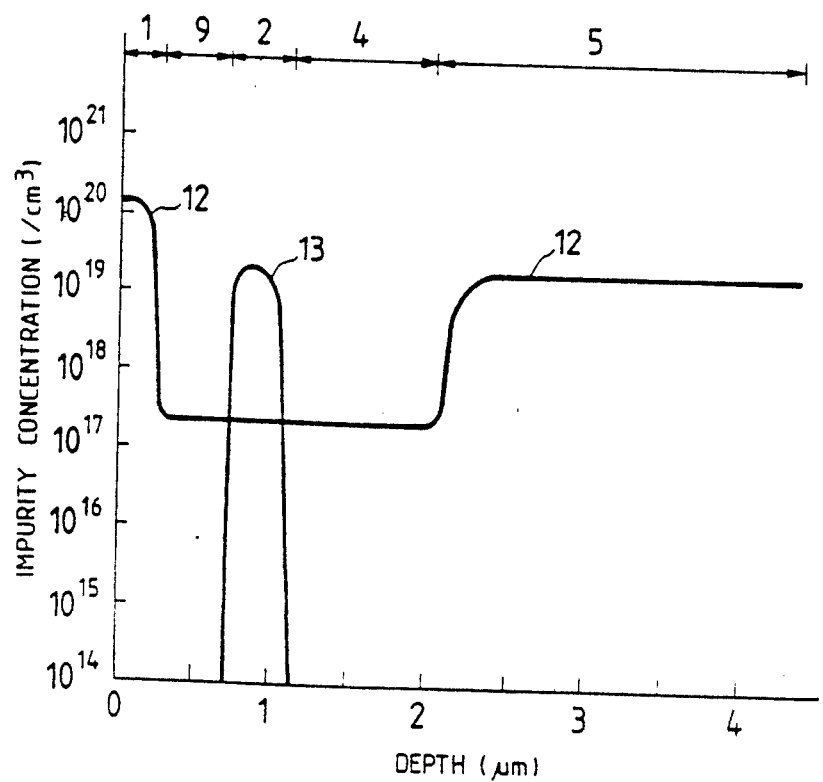

Embodiment 2;

FIGS. 14(A) and (B) are sectional view of an npn silicon bipolar transistor in accordance with a second embodiment of the present invention and a diagram showing its impurity distribution along line d - d'. ln the drawings, like reference numerals are used to identify like constituents as in FIG. 1. Reference numerals 25 and 31 represent n- and p-channel insulated gate field effect transistors formed on the same substrate as the bipolar transistor of the present invention; 28 and 34 are gate electrodes; 26 and 27 are n-type source and drain regions, respectively; 32 and 33 are p-type source and drain regions, respectively; 29 and 35 are gate insulating films made of $SiO_2$; and 30 and 36 are p- and n-type well regions, respectively.

In this embodiment the emitters 1, 9 are formed at positions which interpose the base extension portion 42 and since the parasitic capacitance between the base 3 and the collector 4 is small, the transistor operates at a high speed. The base electrode extension portion 42 is isolated from the emitter regions 1, 9 by a thick insulating film. This thick insulating film can be formed simultaneously with the formation step of the device isolation region of the insulated gate field effect transistors Therefore, the bipolar transistor can be fabricated simultaneously with the formation step of the insulated gate field effect transistors with the exception of the step for forming the p-type base regions 2 and 3, and the embodiment has the advantage that fabrication can be made easily In this embodiment since the bipolar transistor and the insulated gate field effect transistors are formed on the same substrate, it becomes possible to accomplish a Bi-CMOS circuit structure (refer to laterappearing FIG. 22) which combines both of them and a low temperature operation Bi-CMOS semiconductor device having high performance. Particularly at low temperatures below 200° K., the bipolar transistor and the insulated gate field effect transistors can operate at a high speed so that a semiconductor device operating at an extremely high speed can be obtained. Also, in this embodiment the low concentration emitter region 9 and the low concentration collector region 4 are formed in a substantially equal concentration as shown in FIG. 14(B). Therefore, this embodiment has the advantage that substantially the same performance can be obtained even when the emitter and the collector are inversed.

Figure 15A:
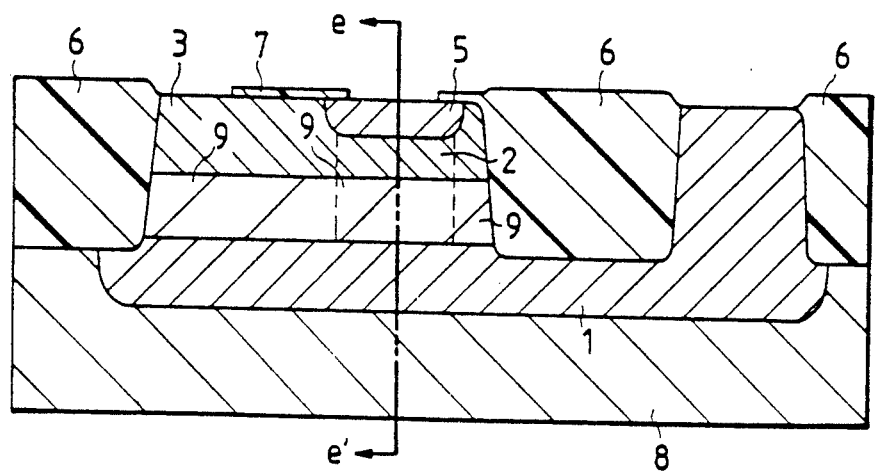
FIGS. 15(A) and (B) are a sectional view of an npn bipolar transistor in accordance with a third embodiment of the present invention and a diagram showing its impurity concentration.
Figure 15B:
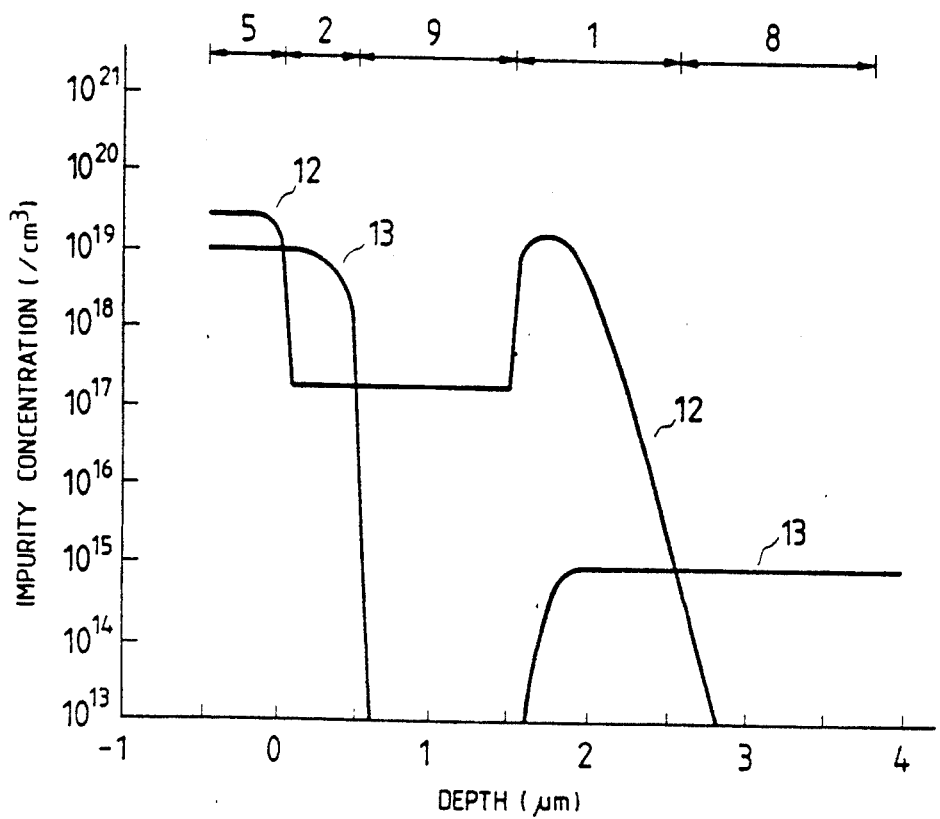

Embodiment 3:

FIGS. 15(A) and (B) are a sectional view of an npn bipolar transistor in accordance with a third embodiment of the present invention and a diagram showing its impurity distribution along line e - e'.

Unlike the structures of the first and second embodiments the structure of this embodiment is such that the emitter region 1 is buried in a deep portion of the substrate 1 while the collector region 5 is formed on the substrate surface. The maximum value of the impurity concentration of the intrinsic base region 2 is $1 \times 10^{19}/cm^3$, the impurity concentration of the low concentration emitter 9 is $3 \times 10^{17}/cm^3$ and the impurity concentration of the collector 5 is $3 \times 10^{19}/cm^3$.

In the structure of this embodiment the base impurity regions 2, 3 are formed near the substrate surface. Therefore, they can be formed by ion implantation at low energy, and the bases 2, 3 having a small width can be formed easily by utilizing the difference of diffusivity of the impurity between the collector 5 and the base. However, the structure of this embodiment involves the drawback that a circuit construction in a backward direction, that is, a circuit construction using the collector 5 as the emitter, cannot be used because the current gain is small.

Figure 16A:
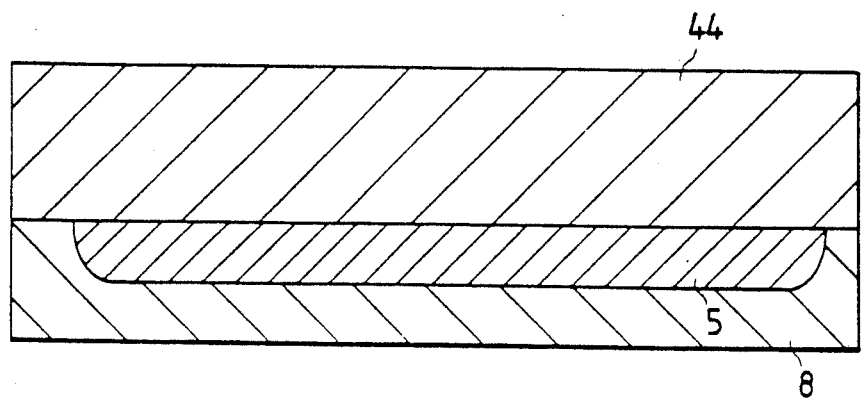
FIGS. 16(A), (B) and (C) are sectional views, showing the fabrication steps of a transistor according to the present invention.
Figure 16B:
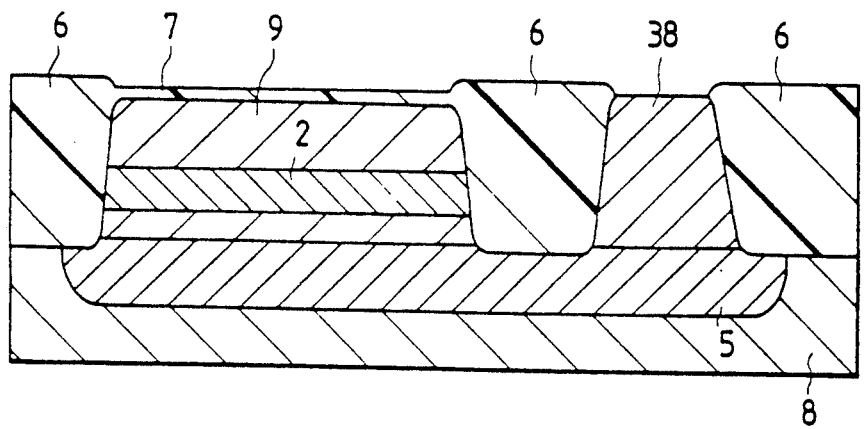
Figure 16C:
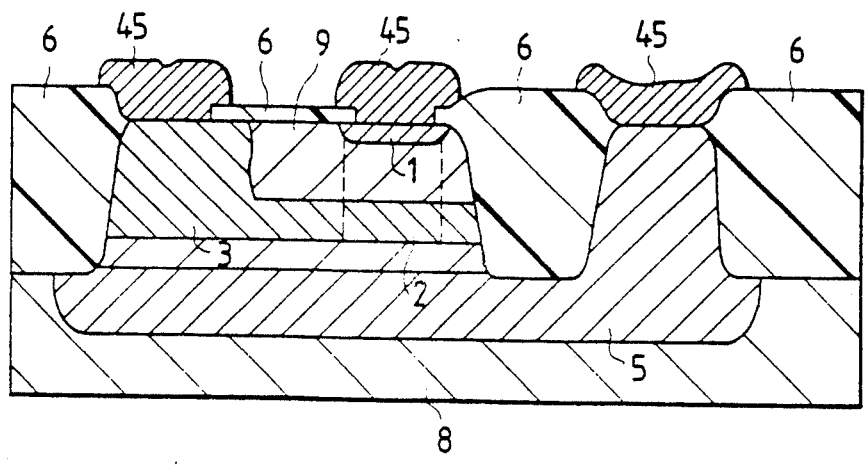

FIGS. 16(A) to (C) are sectional views showing stepwise the fabrication steps of the bipolar transistor of the present invention. First of all, a high impurity concentration n-type collector region 5 is formed on the p-type Si substrate 8 as shown in FIG. 16(A). Next, a 0.3 to 2 $\mu$m-thick single crystal 44 is grown epitaxially on the substrate. Next, as shown in (B), a 5 to 30 nm-thick $SiO_2$ film is formed and then a 0.3 to 3 $\mu$m-thick isolation $SiO_2$ film 6 is formed by local oxidation A high impurity concentration n-type region 38 as the collector electrode extension port is formed by diffusion of phosphorus (P). Furthermore, a p-type impurity such as B is implanted at energy of from about 100 to about 400 KeV in a dose of about $2 \times 10^{13}$ to $1 \times 10^{15}/cm^2$ to form the p-type base region 2. At this time the impurity concentration of the p-type intrinsic base region 2 is from about $1 \times 10^{18}$ to $1 \times 10^{20}/cm^3$ Furthermore, an n-type impurity such as P is implanted in a dose of from about $5 \times 10^{11}$ to about $1 \times 10^{13}/cm^3$ to form a low impurity concentration emitter layer 9.

Next, as shown in FIG. 16(C), the p-type extrinsic base region 3 is formed by a known impurity introduction method such as ion implantation, thermal diffusion, or the like. The n-type emitter region 1 is formed by ion implantation of As in a dose of from $1 \times 10^{14}$ to $1 \times 10^{16}/cm^2$, for example. Finally, an electrode 45 is formed to accomplish the intended high performance bipolar transistor. The base width must be made small in order to improve the high frequency performance of the transistor. Accordingly, heat-treatment during the fabrication process is Preferably carried out at a low temperature or for a short period.

Figure 17A:
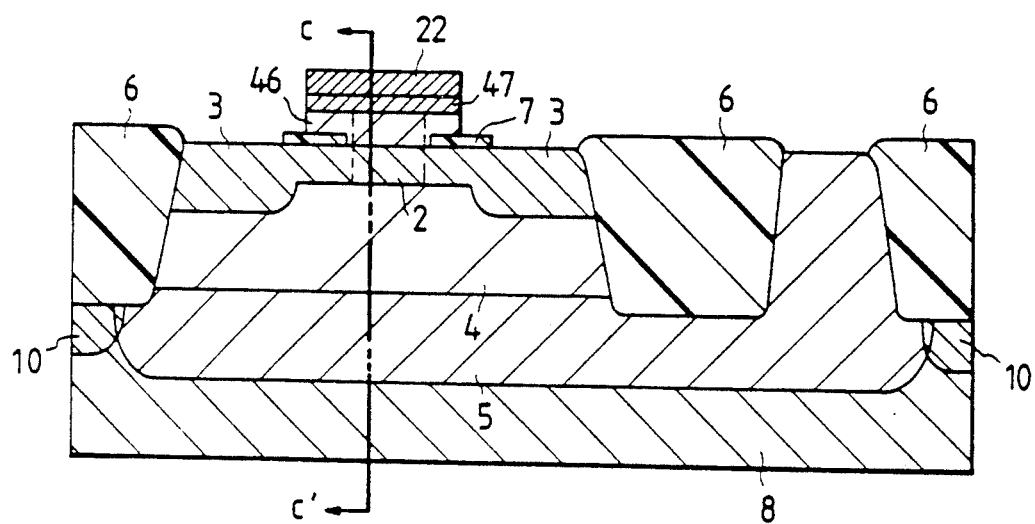
FIGS. 17(A) and (B) are a sectional view of a fourth embodiment of the present invention and a diagram showing its impurity distribution.

Lamp annealing is also effective to carry out heat-treatment for a short period It is also effective to shorten the heat-treatment time by carrying out the base formation step preferably at the latter half of the fabrication process Embodiment 4:

FIGS. 17(A) and (B) are a sectional view showing the npn silicon bipolar transistor in accordance with a fourth embodiment of the present invention and a diagram showing its impurity distribution along line C - C'.

This embodiment uses silicon as the semiconductor substrate. In the drawing, reference numeral 47 represents an n-type silicon high impurity concentration polycrystalline silicon emitter region; 46 is an n-type silicon low impurity concentration polycrystalline silicon emitter region; 22 is an emitter metal electrode layer; 2 is a p-type silicon intrinsic base region; 3 is a p-type silicon extrinsic base region; 4 is an n-type silicon low impurity concentration collector region; 5 is an n-type silicon high impurity concentration collector region; 6 and 7 are $SiO_2$ films; 8 is a p-type silicon substrate; and 10 is a p-type channel stopper region. Here, the high impurity concentration polycrystalline silicon emitter region 47 and the high impurity concentration collector region 5 are low resistance regions formed by introducing a known n-type impurity such as arsenic (As), phosphorus (P) or antimony (Sb) in a concentration of at least $1 \times 10^{19}/cm^3$. The low impurity concentration polycrystalline silicon emitter region 46 is formed by known methods of forming an impurity region such as ion implantation, thermal diffusion, epitaxial growth, CVD (Chemical Vapor Deposition), or the like, in a concentration lower than the maximum value of the p-type impurity concentration in the intrinsic base region 2. To avoid the band narrowing effect in the emitter region 46, the concentration of this low concentration emitter region 9 is preferably below $1 \times 10^{18}/cm^3$.The lower limit of this concentration value can be calculated from the formula (4) and if the depth W of the low concentration region is 0.3 $\mu$m, for example, it must by all means be above $3.7 \times 10^{18}/cm^3$. In order to obtain the clear effect of the low concentration emitter layer, the lower limit is preferably about 1/5 W.

Figure 17B:
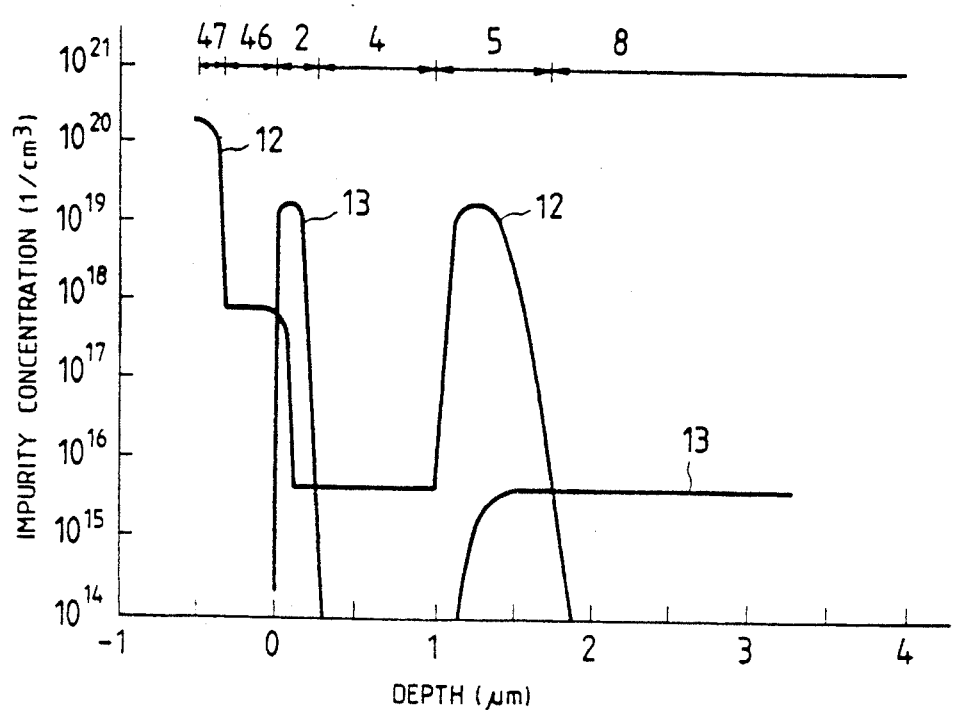

To avoid any adverse influences of bandgap narrowing in the high impurity concentration emitter region 47 on the transistor operation characteristics, the distance between the high impurity concentration emitter region 47 and the intrinsic base region 2 (that is, the width of the low impurity concentration emitter region 46) is preferably at least 0.1 μm. The p-type intrinsic base region 2 is formed by known methods of forming impurity regions such as ion implantation, thermal diffusion, epitaxial growth, or the like, by use of a known p-type impurity such as boron (B). The maximum value of the impurity concentration of this p-type impurity concentration is at least $1 \times 10^{18}/cm^3$ As shown in FIG. 17(B), the impurity concentration distribution of the p-type intrinsic base region 2 is set so that it decreases from the junction with the emitter 46 to the junction with the collector 4. By so doing a built-in electric field is formed in the base region and the drifting speed of the electrons is accelerated in the base. Therefore, this embodiment is suitable for a high speed operation.

The n-type low impurity concentration collector region 4 is formed in the concentration lower than the low impurity concentration polycrystalline silicon emitter region 46 so as to reduce the junction capacitance between the base and the collector.

This embodiment particularly uses As as the impurity for forming the high impurity concentration emitter region 47 in a concentration of $1 \times 10^{20}/cm^3$ and Sb as the impurity for forming the low impurity concentration emitter 46 in a concentration of about $8 \times 10^{17}/cm^3$. Since its impurity level is low, Sb has the advantage that it is not so easily affected by freeze-out of the carriers in the low temperature operation. Boron (B) is used as the impurity for the p-type intrinsic base region 2 and the maximum value of the impurity concentration is set to $3 \times 10^{19}/cm^3$ phosphorus (P) is used as the impurity for the n-type low impurity concentration collector region 4 and its impurity concentration is set to $5 \times 10^{15}/cm^3$. This embodiment has the same characterizing features as those of the first embodiment.

Figure 18:
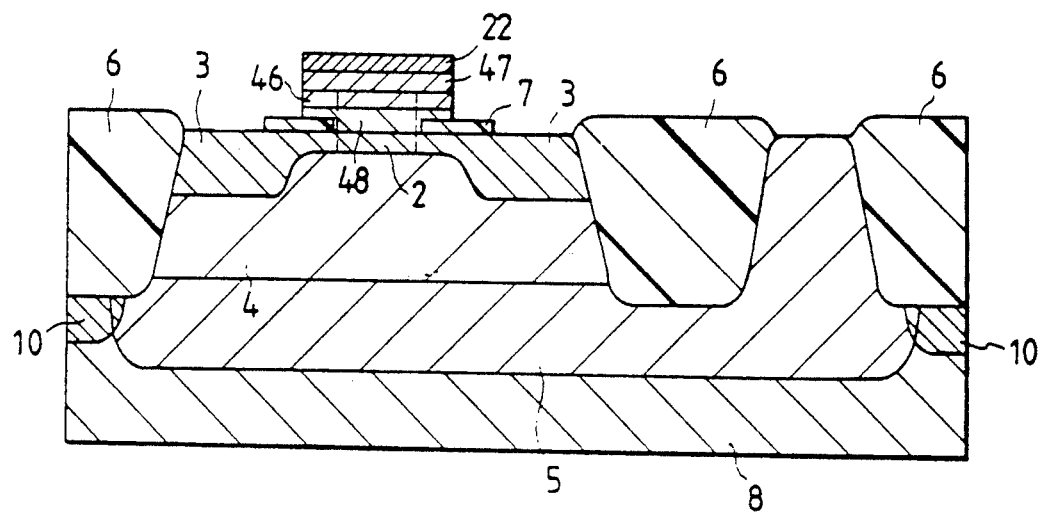
FIGS. 18 and 19 are sectional views of the bipolar transistors in accordance with a fifth and sixth embodiment of the present invention.

Embodiment 5:

FIG. 18 is a sectional view of an npn silicon bipolar transistor in accordance with the fifth embodiment of a present invention. This embodiment is different from the fourth embodiment in that the emitter-base junction portion between the low impurity concentration emitter 46 and the high impurity concentration polycrystalline silicon intrinsic base 48 is formed in the region of polycrystalline silicon, amorphous silicon or their recrystallized silicon that is laminated on the substrate. The structure of this embodiment has exactly the same features as those of the first embodiment.

Figure 19:
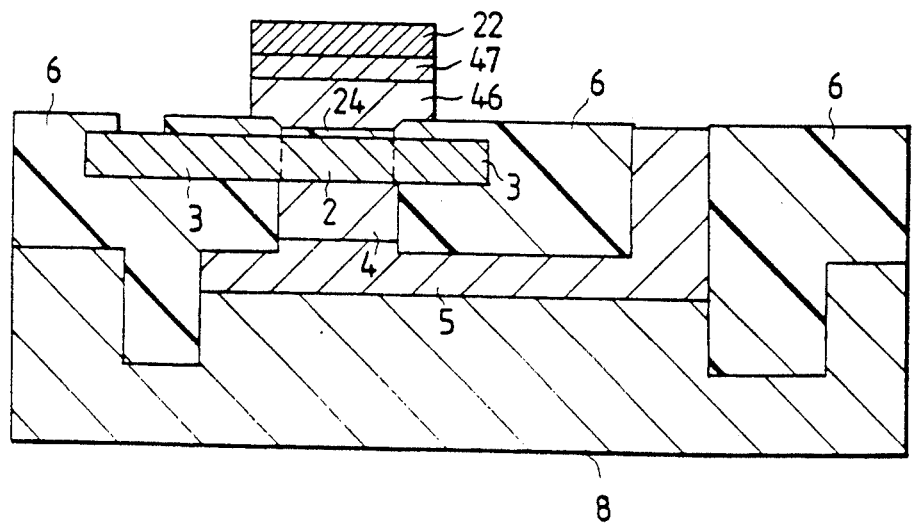

Embodiment 6:

FIG. 19 is a sectional view of an npn silicon bipolar transistor in accordance with a sixth embodiment of the present invention. In this embodiment an extremely thin insulating film 24 such as a 5 to 50 Å-thick $SiO_2$ film, $Si_3N_4$ film or $SiO_xN_y$ film is formed between the low concentration emitter region 46 and the high concentration intrinsic base region 2. In this embodiment, too, a great current gain can be obtained due to the bandgap narrowing effect of the intrinsic base region at a low temperature below 200° K. in the same way as in the first embodiment. In addition, and since the thin insulating film 24 is formed in this embodiment, the current gain can be improved. Next, the improvement will be explained. Though electrons or positive holes can tunnel through this thin insulating film due to the tunneling effect, the tunneling probability is higher for the electrons than for the positive holes. The tunneling probability due to the tunnel effect is proportional to $\exp(-A\sqrt{m^*})$ as explained on page 522 of Physics of Semiconductor Devices, SECOND EDITION, 1981. Here, symbol A is a proportional constant and $m^*$ is an effective mass of carriers Since the effective mass of the electrons is smaller than that of the positive holes, the tunneling probability through the insulating film 24 is greater for the electrons. Therefore, the positive hole current injected reversely from the base to the emitter is suppressed by the effect of the insulating film and the current gain is improved.

Figure 13A:
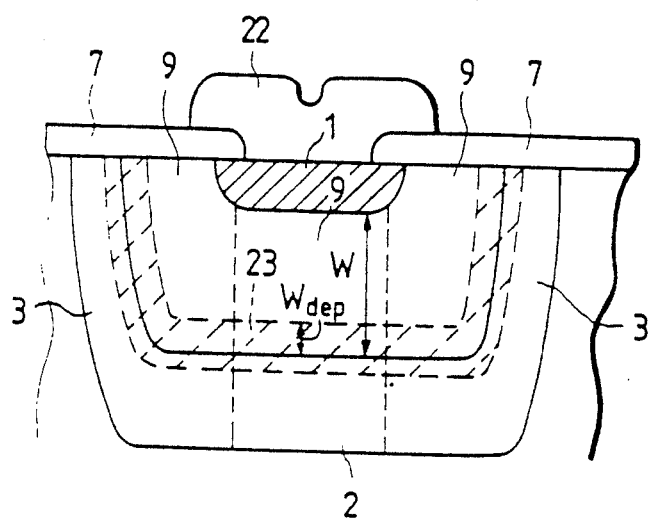
FIGS. 13(A) and (B) are sectional views of the emitter and base of the bipolar transistor of the present invention.
Figure 13B:
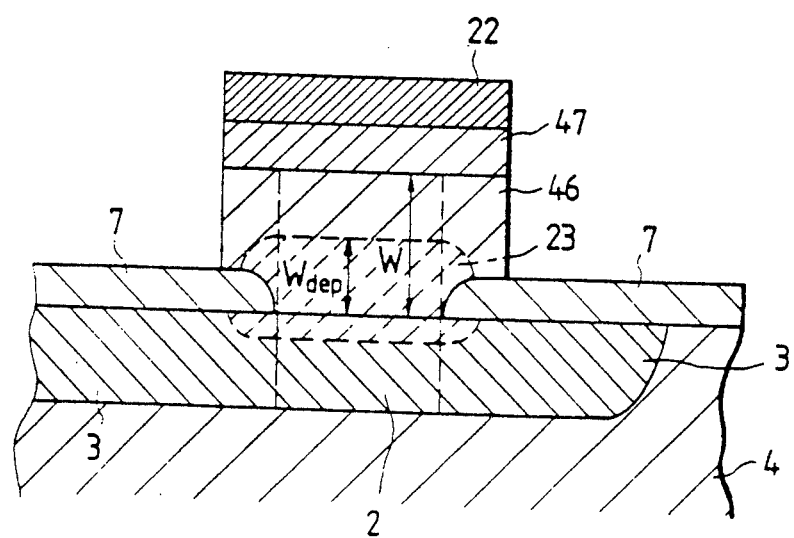
Figure 20:
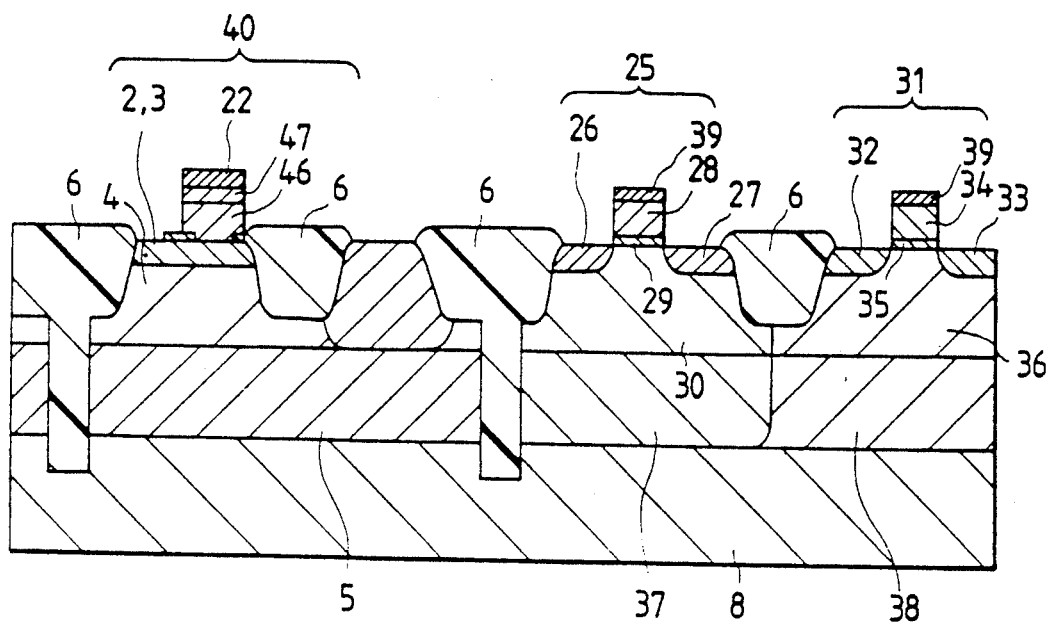
FIG. 20 is a sectional view of an npn bipolar transistor in accordance with a seventh embodiment of the present invention and an insulated gate field effect transistor formed on the same substrate as the bipolar transistor.

If an N-containing film such as $Si_3N_4$, $SiO_xN_y$, or the like, is used as this thin insulating film 24, the film suppresses the thermal diffusion of boron in the base 2 into the low concentration emitter because its structure is compact In other words, this nitride film makes it possible to remarkably reduce the base width so that a high speed operation becomes possible In this embodiment, since the thick $SiO_2$ film 6 is formed at the lower part of the extrinsic base region 3, the junction capacitance between the base and the collector can be reduced drastically so that the embodiment is suitable for a high speed operation Embodiment 7:

FIG. 20 shows a seventh embodiment of the present invention. In the drawing, like reference numerals are used to identify like constituents as in FIG. 13(B). Reference numerals 25 and 31 represent n- and p-channel insulated gate field effect transistors formed on the same substrate as the bipolar transistor 40 of the present invention (see FIG. 17 of the fourth embodiment); 28 and 34 are gate electrodes; 39 is a transition metal or transition-metal compound region for reducing the resistance of the gate electrodes; 26 and 27 are n-type source and drain region; 33 and 32 are p-type source and drain regions; 29 and 35 are gate insulating films; 30 and 36 are p- and n-type well regions; and 37 and 38 are high concentration p- and n-type regions formed to reduce the resistance of the well regions, respectively Since the bipolar transistor and the insulated gate field effect transistors are formed on the same chip in this embodiment, a circuit construction consisting of their combination becomes possible. When a Bi-CMOS device incorporating the bipolar transistor of the present invention is operated at low temperature of below 200° K., high speed operation of both the bipolar transistor and the insulated gate field effect transistors becomes possible so that a semiconductor device operating at an extremely high speed can be attained.

Figure 21:
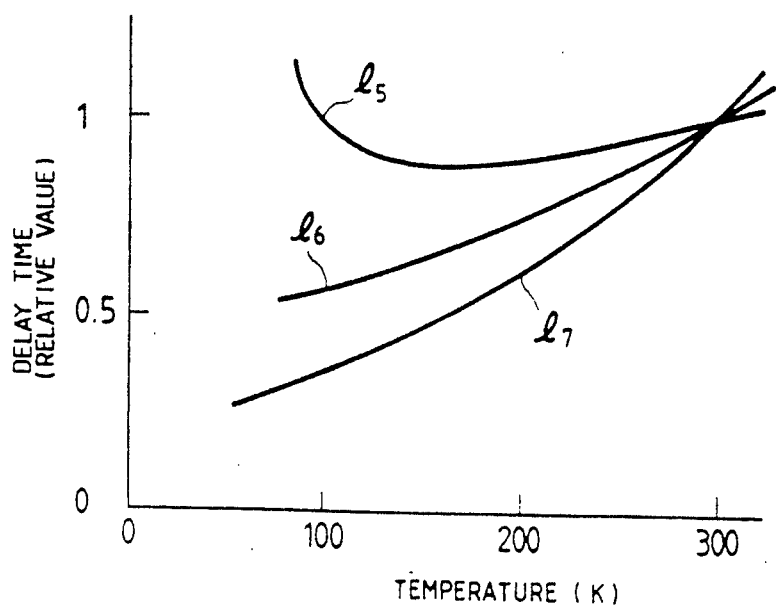
FIG. 21 is a diagram showing temperature dependence of the delay time of each of the BiCMOS device shown in FIG. 20 and an inverter circuit consisting of a conventional CMOS device.

It is known conventionally that when a CMOS device is operated at low temperature, its operation speed can be improved Line $l_6$ in FIG. 21 represents temperature dependence of the delay time of the CMOS inverter. In the drawing, line $l_5$ represents the temperature dependence of delay time of an inverter consisting of a conventional Bi-CMOS device. When the conventional Bi-CMOS device is operated at low temperature, the performance of MOSFET can be improved whereas the performance of the bipolar transistor gets deteriorated. Therefore, the Bi-CMOS performance is not much improved. Particularly at low temperature below 150° K., the delay time increases with a temperature drop due to the influences of the deterioration of the bipolar transistor performance. In contrast, the BiCMOS device of this embodiment is characterized in that the improvement in the performance in the low temperature operation is extremely great as represented by the line $l_7$.

Figure 22:
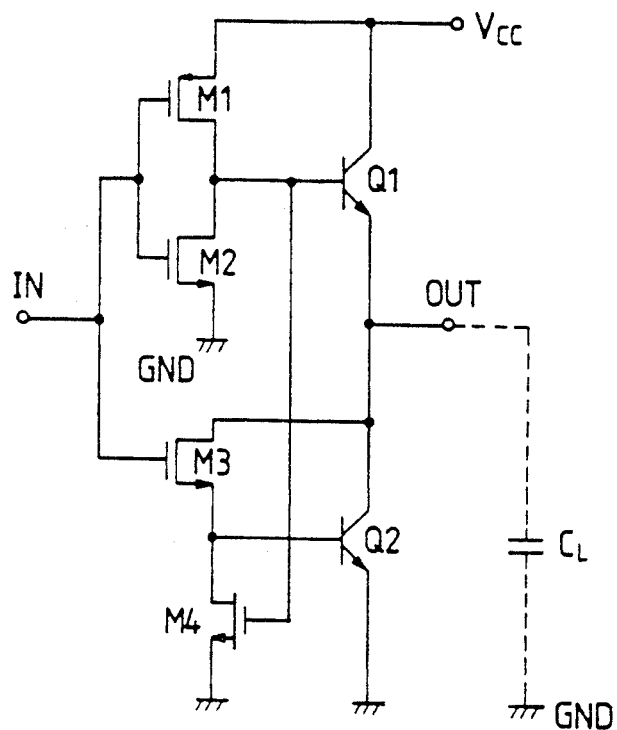
FIG. 22 is a circuit diagram of a Bi-CMOS device in accordance with the present invention.

FIG. 22 is a circuit diagram of the low temperature operation BiCMOS device of this embodiment. The prestage logic circuit includes MOSFETs M1 to M4 and the push-pull output stage circuit includes the bipolar transistors Q1, Q2 of a totem pole connection. The gate of the p-channel MOSFET M1 and that of the n-channel MOSFET M2 are connected to the input IN, the source of M1 is connected to the positive power source voltage $V_{cc}$, the source of M2 is connected to the ground GND, and the drains of M1 and M2 are connected commonly. Therefore, M1 and M2 together constitute a CMOS inverter.

Since the collector, base and emitter of the transistor Q1 are connected to the positive power source voltage $V_{cc}$, to the output of the CMOS inverter circuit M1, M2 and to the output OUT, the bipolar transistor Q1 charges at a high speed the load capacitance $C_L$ of the output OUT towards the power source $V_{cc}$ in response to the output of the CMOS inverter M1, M2.

Since the base of the bipolar transistor Q2 responds to the source follower output of the n-channel MOSFET M3 whose gate is connected to the input, the load capacitance Chd L of the output OUT discharges at a high speed towards the ground GND through the collector-emitter current path of Q2.

Carrier scattering of MOSFETs M1 to M4 in the channel region becomes less at low temperature of 150° K. or below and carrier mobility becomes high so that the delay time becomes small.

The impurity concentration of the intrinsic base regions of the bipolar transistors Q1, Q2 is at least $1 \times 10^{18}/cm^3$ and the impurity concentration of the intrinsic emitter region is lower than that of the intrinsic base region. Therefore, the current gains of the transistors Q1, Q2 at low temperature of 150° K. or below can be improved and the charge/discharge speed of the load capacitance can be improved, too.

As described already in the description of the first embodiment, build up of the positive holes to the collector hardly occurs in the saturation operation of the bipolar transistor of the present invention. Therefore, the bipolar transistor operates at a high speed. Due to this effect the operation speed of the BiCMOS circuit shown in FIG. 22 can be improved drastically. If the pulse of the input is at a high speed when the charge stored in the load capacitance $C_L$ is discharged by the bipolar transistor Q2, it is likely to occur that the potential of the output OUT reaches near the level of GND at the base potential of Q2 being about 1 V. At this time the bipolar transistor operates in the saturation region so that in ordinary BiCMOS devices for room temperature operation, the positive holes are built up in the low concentration collector region and the next operation is remarkably delayed. In the low temperature operation of the BiCMOS device of the present invention, however, the built-up effect of the positive holes in the low concentration connector becomes extremely small so that the device operates at a high speed.

It is of course possible to obtain likewise a high performance BiCMOS even when the bipolar transistor structure shown in FIG. 20 is replaced by the structure such as the structure of the first embodiment wherein the emitter region and the base region are formed inside the substrate.

Figure 23:
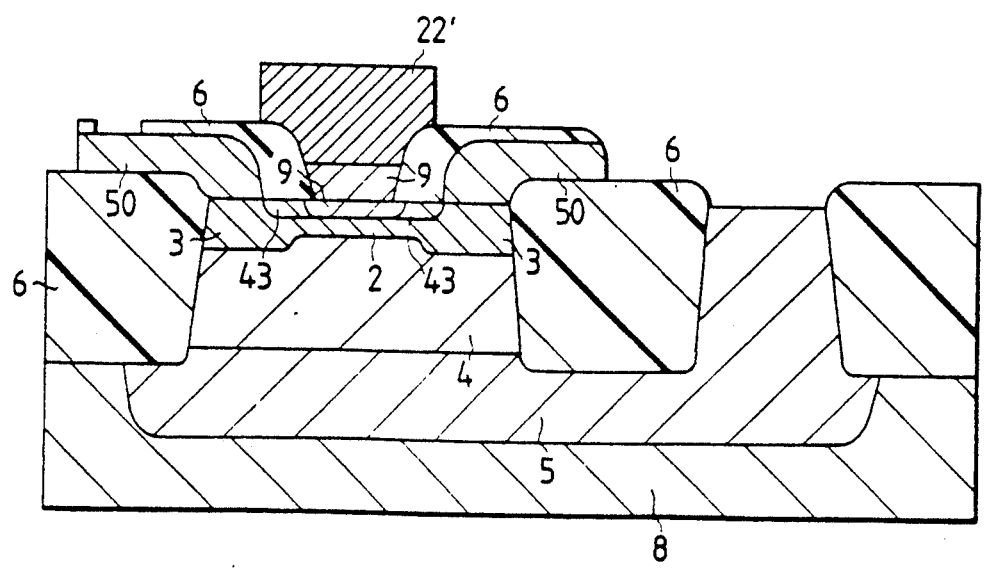
FIG. 23 is a sectional view of a bipolar transistor in accordance with an eighth embodiment of the present invention.

Embodiment 8:

FIG. 23 shows the npn bipolar transistor in accordance with an eighth embodiment of the present invention. Unlike the structure of the first embodiment this embodiment has the structure wherein the low concentration p-type extrinsic base region 43 is formed between a low concentration n-type emitter 9 and the extrinsic base region 3. More definitely, a region containing B in a concentration of $1 \times 10^{17}/cm^3$ to $3 \times 10^{19}/cm^3$ is formed by a known impurity introduction method such as ion implantation. This low concentration p-type base region 43 is set to be lower than the concentration of the high concentration p-type base region 3 and more preferably, to a concentration lower than that of the intrinsic base region 2 According to this arrangement the ineffective electron current component injected from the low concentration emitter 9 to the extrinsic base region 3 can be reduced drastically. The reason will be next explained.

Figure 8:
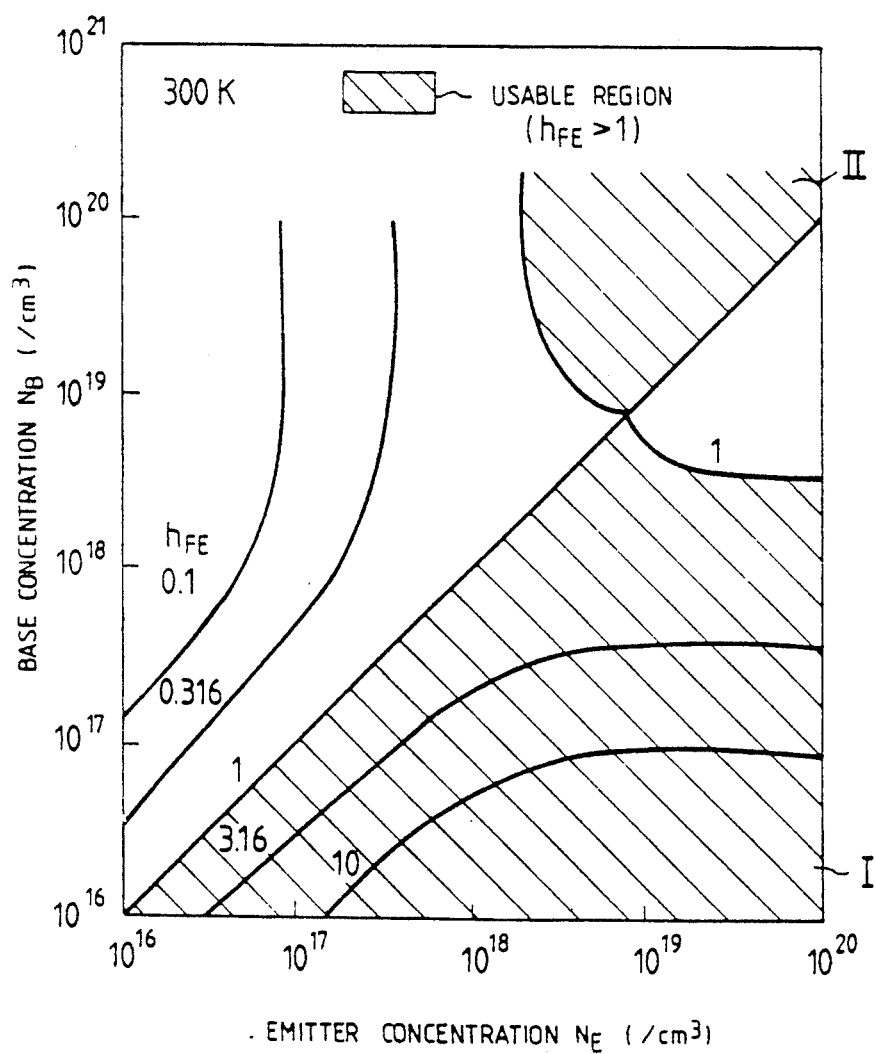
FIG. 8 is a diagram showing impurity concentration dependence of a current gain at room temperature (300° K.)
Figure 9:
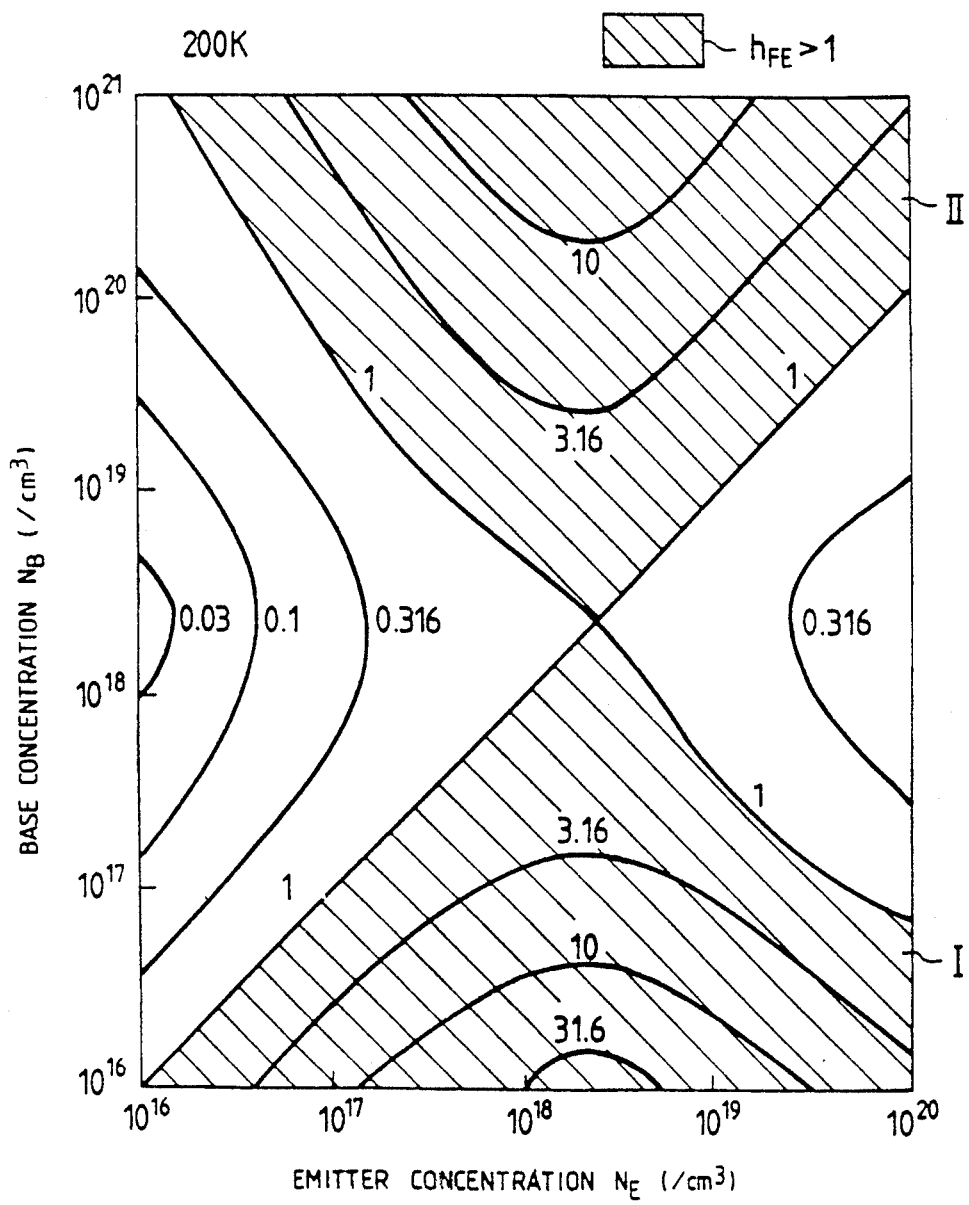
FIG. 9 is a diagram showing impurity concentration dependence of the current gain at 200° K.
Figure 10:
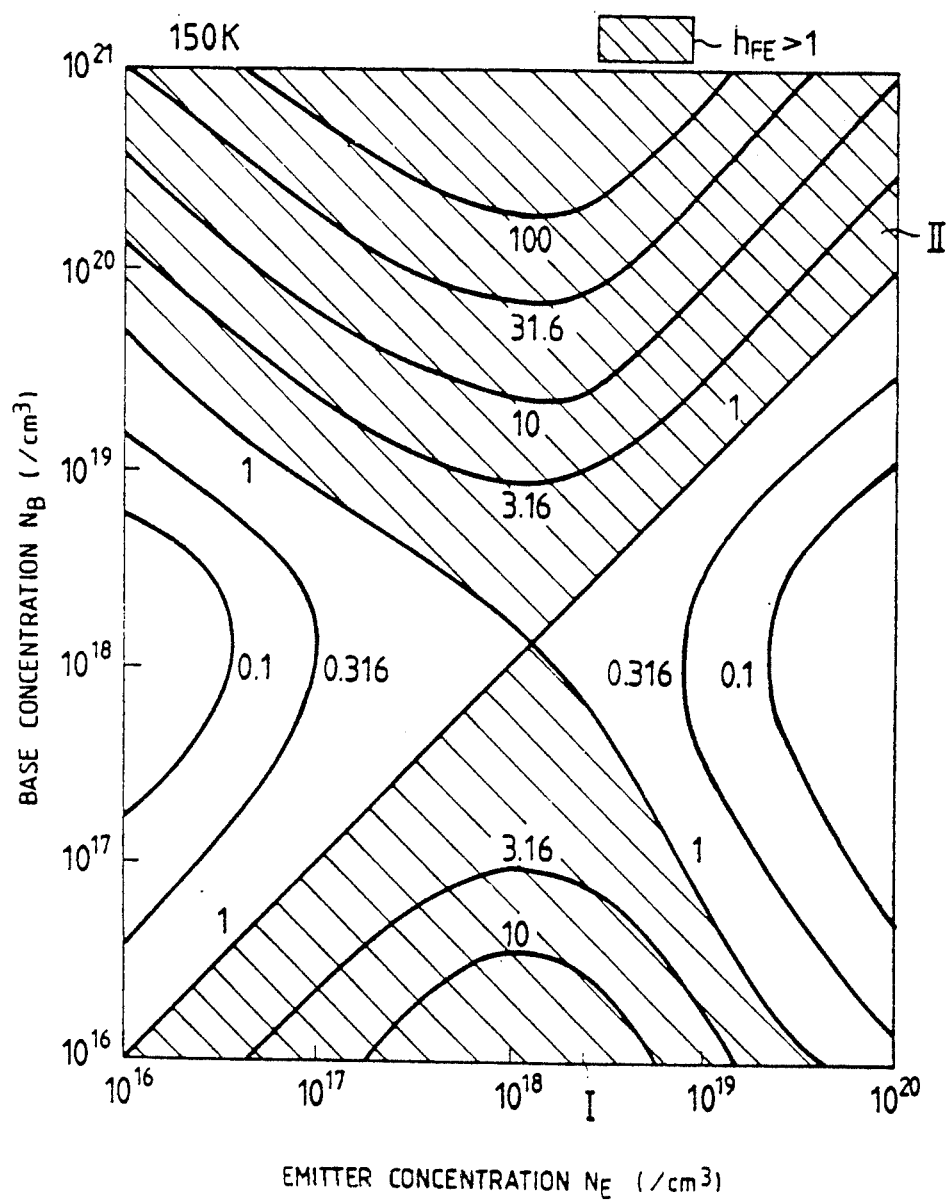
FIG. 10 is a diagram showing the current gain at 150° K.
Figure 11:
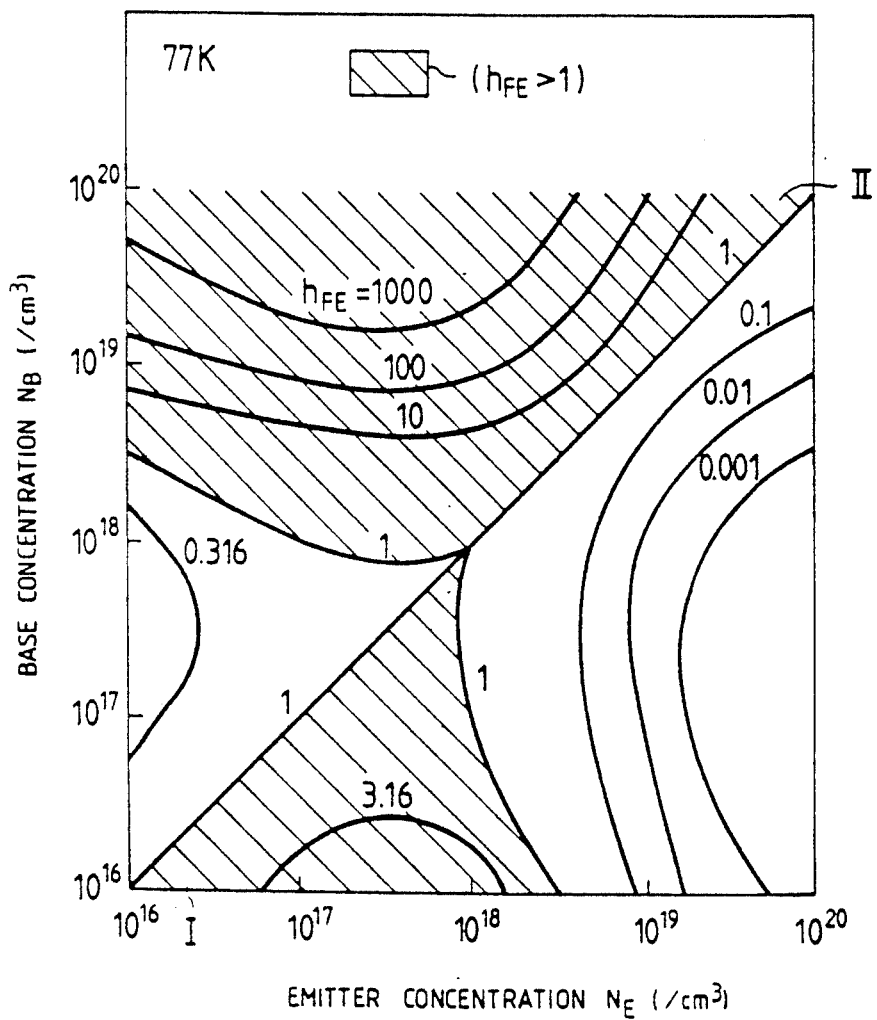
FIG. 11 is a diagram showing the current gain at 77° K.
Figure 12:
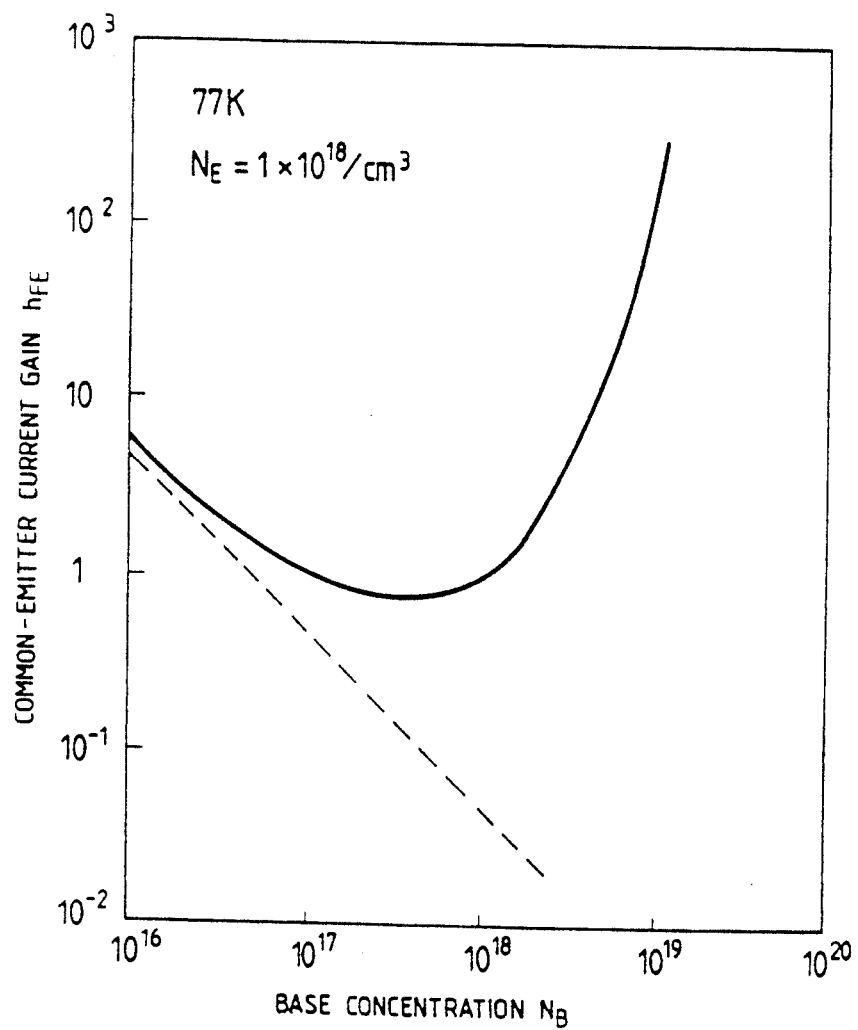
FIG. 12 is a diagram showing dependence of a common-emitter current gain of the bipolar transistor of the present invention on the impurity concentration of an intrinsic base region.

As shown in FIGS. 8 and 11, the concentration dependence of the $h_{FE}$ value is entirely different between room temperature and low temperature This means that the concentration dependence of the injection efficiency of the electrons injected from the emitter to the base differs remarkably, too. Here, if the concentration of the low concentration emitter region 9 is a typical concentration value of $1 \times 10^{18}/cm^3$ by way of example, $h_{FE}$ becomes minimal when the base concentration is about $1 \times 10^{18}/cm^3$ at 77° K. in accordance with FIG. 11. In other words, injection of the electrons becomes minimal When the electrons are injected from the emitter to the extrinsic base, they are built up in the extrinsic base so that $h_{FE}$ and $f_T$ get deteriorated. Therefore, the smaller the quantity of the electrons injected from the emitter to the extrinsic base, the better. As described above, if the p-type region 43 having a low concentration of about $1 \times 10^{18}/cm^3$ is formed between the low concentration emitter region 9 and the extrinsic base 3, $h_{FE}$ and $f_T$ can be improved.

In the embodiment above, a metal having a small work function such as Ti (titanium), Nb (niobium), In (indium) or TiN (titanium nitride) (that is, a metal having a work function of almost 4.6 eV or more) is used as the metal electrode 22'. The low concentration emitter 9 and the metal are directly connected. According to this arrangement a low contact resistance can be accomplished without forming any high concentration n-type region and the fabrication process can be simplified. This embodiment has the same features as those of the first embodiment.

Figure 24A:
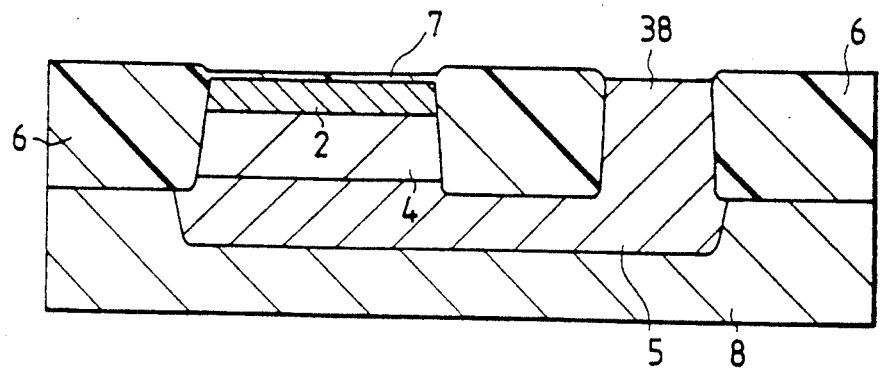
FIGS. 24(A), (B) and (C) are sectional views showing the fabrication steps of the bipolar transistor in the embodiments of the present invention.
Figure 24B:
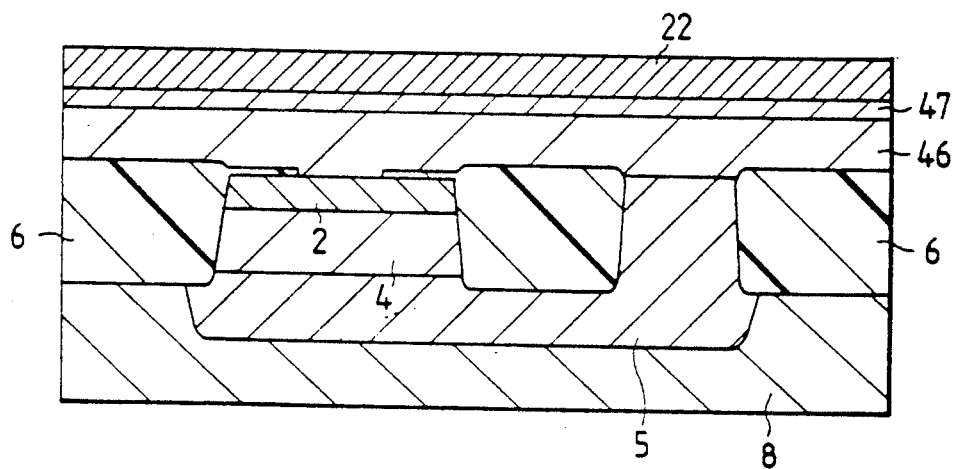
Figure 24C:
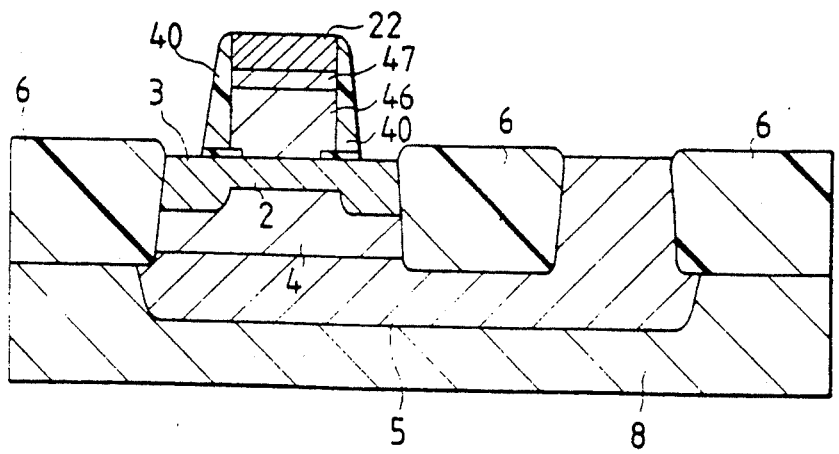

FIGS. 24(A) to (C) are sectional views showing stepwise the fabrication process of the bipolar transistor of the present invention. First of all, as shown in (A), the high impurity concentration collector region 5 is formed on the surface of the P-type Si substrate. Next, a 0.3 to 2 μm-thick n-type single crystal is grown epitaxially on the substrate, followed then by the formation of a 5 to 30 nm-thick $SiO_2$ film 7 and a 0.3 to 3 μm-thick $SiO_2$ film 6 for isolation. A high impurity concentration n-type region 38 as the collector electrode extension port is formed by the diffusion of phosphorus (P) as the impurity. Furthermore, a p-type impurity, e.g. B, is ion-implanted at an energy of about 5 to about 20 KeV and in a dose of from about $2 \times 10^{13}$ to about $1 \times 15/cm^3$ to form a p-type base region 2. At this time the impurity concentration of the p-type intrinsic base region is from about $1 \times 10^{18}$ to $1 \times 10^{20}/cm^3$.

Next, as shown in FIG. 24(B), after an emitter electrode hole is bored on the thin $SiO_2$ film 7, a 50 to 400 nm-thick n-doped polycrystalline silicon film 46 is deposited by CVD (Chemical Vapor Deposition). At this time the impurity concentration is from about $5\times 10^{16}$ to about $1\times 10^{19}/cm^3$ and is lower than the concentration of the p-type region 2. This n-type Polycrystalline silicon film 46 may thereafter be grown selectively and epitaxially only on the emitter electrode hole. In this case Si ions are implanted in polycrystal in a dose of at least $1\times 10^{14}/cm^3$ to render it amorphous and thereafter epitaxial growth can be carried out on Si by annealing at 800° C. or below.

Furthermore, an n-type high impurity concentration polycrystalline silicon film 47 is deposited by CVD. The impurity concentration at this time is preferably such that an ohmic contact can be established with the metal and more definitely, is at least $5\times 10^{19}/cm^3$. Next, in order to reduce the resistance of the emitter electrode, a film 22 made of a transition metal and a transition metal compound is vacuum evaporated by known method such as CVD or spattering. Here, it is possible to use W, Mo, Ti, Pt, or their silicides as the transition metal and the transition metal compound.

Thereafter, as shown in FIG. 24(C), the polycrystalline silicon films 46, 47 and the transition metal or transition metal compound film 22 are etched by known photoetching so as to leave only the emitter electrode region. Next, a sidewall region 40 made of $SiO_2$ is formed by a known technique. Furthermore, B ions are implanted in a dose of from about $5\times 10^{14}$ to about $5\times 10^{15}/cm^2$ and at energy of 5 to 30 KeV to form an extrinsic base region 3 and thus to obtain the intended high performance bipolar transistor.

Though the embodiments described above use the Si npn bipolar transistor by way of example, the substrate material is not particularly limited to Si Ge, mixed crystal of SiGe, GaAs, and the like, may of course be used. The present invention can of course be applied to a pnp bipolar transistor, too. In such a case the low concentration emitter region 9 is formed by use of boron (B) and the intrinsic base region 2 is formed by an n-type impurity such as arsenic (As), phosphorus (P), antimony (Sb), or the like.

In the embodiments given above, the current of the bipolar transistor flows in a direction perpendicular to the substrate surface, but it is of course possible to employ a structure wherein the current flows in parallel with, or slantingly to, the substrate surface.

Though the foregoing embodiments use the vertical bipolar transistor by way of example, the present invention can of course be applied to lateral bipolar transistors, too In accordance with the present invention described above, the maximum value of the intrinsic base region of the bipolar transistor is at least $1\times 10^{18}/cm^3$, the region having a lower impurity concentration than the maximum value of the intrinsic base region is formed at at least part of the emitter region and the junction portion between the base and the emitter is made of the same, or substantially the same, material with the exception that the impurity contents are different Therefore, the bipolar transistor of the present invention exhibits an entirely different operation mechanism within the temperature range of below 200° K. from that at room temperature and a practically sufficient current gain at such a low temperature, has a small base resistance and a small emitter-base junction capacitance and therefore operates at a high operation speed. Furthermore, the bipolar transistor of the present invention has an increased emitter-base breakdown voltage, and has a large transconductance in the lower temperature operation and hence high current driving ability When assembled in a semiconductor apparatus, the bipolar transistor of the Present invention can improve the operation speed of the semiconductor apparatus. Moreover, these excellent characteristics can be accomplished easily by simple fabrication techniques.

What is claimed is:

1. A semiconductor apparatus comprising:
a semiconductor substrate; and
means for cooling said semiconductor substrate down to an operation temperature substantially below 200° K.;
wherein said semiconductor substrate contains on the surface thereof at least one npn bipolar transistor;
wherein in an intrinsic base region of the npn bipolar transistor, the impurity concentration of the p type base region is set to be at least $1\times 10^{18}/cm^3$;
wherein in a first region of an emitter region of said npn bipolar transistor an impurity concentration of the in type n said first portion is lower than said maximum value of the p type impurity concentration of the intrinsic base region; and
wherein said intrinsic base region and said first region in said emitter region of said npn bipolar transistor are made of substantially the same material except for the p and n type impurities.

2. The semiconductor apparatus of claim 1 wherein said emitter region comprises a second region and an impurity concentraiton of the n type impurity in said second region is set to be at least $1\times 10^{19}cm^3$; and
wherein said first region of said emitter region is connected to an emitter electrode through said second region of said emitter region.

3. The semiconductor apparatus according to calim 1, wherien a thin insulating film is formed between said base region and said first region in said emitter region, said thin insulating film suppressing inverse injection of positive holes from said intrinsic base region into said first region of said emitter reigon.

4. The semiconductor apparatus according to calim 1, wherein said bipolar transistor further includes a high impurity concentration first extrinsic base region connected to said intrinsic base region; and
wherein a low impurity concentration second extrinsic base region is formed between said first region in said emitter region and said high impurity concentration first extrinsic base region.

5. The semiconductor apparatus of claim 1, wherein said maximum value of the impurity concentration of the p type impurities of said intrinsic base region is said to be at least $1\times 19/cm^3$.

6. The semiconductor apparatus according to claim 1, wherien said semiconductor substrate includes on the surface thereof a plurality of insulated gate field effect transistors.

7. The semiconductor apparatus of claim 6, wherein said plurality of insulated gate field effect transistors constitute a complementary circuit containing at least a one N-channel transistor and at least one P-channel transistor; and
wherein said npn bipolar transistor is driven by the output of said complementary circuit.

* * * * *

UNITED STATES PATENT AND TRADEMARK OFFICE
CERTIFICATE OF CORRECTION

PATENT NO. : 5,041,892

DATED : 20 August 1991

INVENTOR(S) : Kazuo Yano et al

It is certified that error appears in the above-identified patent and that said Letters Patent is hereby corrected as shown below:

| Column | Line | |
|---|---|---|
| 1 | 28 | Change "SiO" to --$SiO_2$--. |
| 2 | 7 | Change "100" to --100--. |
| 2 | 31 | Change "intr±nsic" to --intrinsic--. |
| 3 | 13 | Change "much" to --very--. |
| 3 | 29 | Change "p. D." to --P. D.-- |
| 5 | 49 | Change "hFE" to --$h_{FE}$--. |
| 5 | 54 | Change "does" to --represents--. |
| 6 | 43 | Change "1 x $10^{18}$/$cm^3$ to --1 x $10^{18}$/$cm^3$.--. |
| 6 | 48 | Change "g:on." to --gion.--. |
| 8 | 13 | Change "of them" to --thereof--. |
| 8 | 16 | Change "sufficient" to --sufficiently--. |
| 8 | 62 | Change "n.on" to --n on--. |
| 9 | 31 | Before "bipolar" delete "the--. |
| 9 | 59 | Change "6 $SiO_2$" to --6, 7 $SiO_2$--. |
| 10 | 17 | Change "29 gate" to --29, 35 gate--. |
| 10 | 25 | After "transition-metal" delete ".". |
| 10 | 47 | Before "DESCRIPTION" insert --DETAILED--. |

UNITED STATES PATENT AND TRADEMARK OFFICE
CERTIFICATE OF CORRECTION

PATENT NO.  : 5,041,892
DATED       : 20 August 1991
INVENTOR(S) : Kazuo YANO et al It is certified that error appears in the above-identified patent and that said Letters Patent is hereby corrected as shown below:

| Column | Line | |
|--------|------|---|
| 11 | 3  | Before "is" insert --4--. |
| 11 | 6  | Before "is" (first occurrence) insert --8--. |
| 11 | 15 | Change "imPurity" to --impurity--. |
| 11 | 16 | Change "CvD" to --CVD--. |
| 11 | 17 | Change "Deposit±on" to --Deposition--. |
| 11 | 46 | After "doing" insert --,--. |
| 11 | 65 | After "xm$^3$" insert --.--. |
| 12 | 13 | Change "imPurity" to --impurity--. |
| 13 | 11 | After "transistors" insert --.--. |
| 13 | 21 | Change "laterappearing" to --later-appearing--. |
| 13 | 68 | After "oxidation" insert --.--. |
| 14 | 5  | Unbold "1 x 10$^{15}$". |
| 14 | 8  | Change "1 x 10$^{18}$ to 1 x 10$^{20}$" to --1 x 10$^{18}$ to 1 x 10$^{20}$--. |
| 14 | 22 | Change "Preferably" to --preferably--. |
| 14 | 25 | After "period" insert --.--. |
| 14 | 28 | After "process" insert --.--. |
| 15 | 13 | After "cm$^3$" insert --. --. |

UNITED STATES PATENT AND TRADEMARK OFFICE
CERTIFICATE OF CORRECTION

PATENT NO. : 5,041,892

DATED : 20 August 1991

INVENTOR(S) : Kazuo YANO et al

It is certified that error appears in the above-identified patent and that said Letters Patent is hereby corrected as shown below:

| Column | Line | |
|---|---|---|
| 15 | 36 | Change "cm³ phosphorus" to --cm³. Phosphorus--. |
| 15 | 43 | Change "the fifth embodiment of a" to --a fifth embodiment of the--. |
| 16 | 4 | Change "p/-A..." to --p(-A...--. |
| 16 | 7 | After "carriers" insert --. --. |
| 16 | 18 | After "compact" insert --. --. |
| 16 | 20 | After "possible" insert --.--. |
| 16 | 25 | After "operation" insert --.--. |
| 16 | 54 | After "improved" insert --. --. |
| 17 | 25 | Change "Chd L" to --$C_L$--. |
| 18 | 21 | After "temperature" (second occurrence) insert --. --. |
| 18 | 30 | After "minimal" insert --. --. |
| 19 | 30 | Unbold "5 to 30". |
| 19 | 35 | After "Si" insert --. --. |

UNITED STATES PATENT AND TRADEMARK OFFICE
CERTIFICATE OF CORRECTION

PATENT NO. : 5,041,892

DATED : 20 August 1991

INVENTOR(S) : Kazuo YANO et al

It is certified that error appears in the above-identified patent and that said Letters Patent is hereby corrected as shown below:

| Column | Line | |
|---|---|---|
| 20 | 4 | After "ability" insert --. --. |
| 20 | 6 | Change "Present" to --present--. |
| 20 | 23 | Change "in type n" to --n type in--. |
| 20 | 33 | Change "concentraition" to --concentration--. |
| 20 | 38 | Change calim" to --claim--. |
| 20 | 39 | Change "wherien" to --wherein--. |
| 20 | 44 | Change calim" to --claim--. |
| 20 | 57 | Change "wherien" to --wherein--. |

Signed and Sealed this

Twenty-first Day of September, 1993

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO. : 5,041,892
DATED : August 20, 1991
INVENTOR(S) : Kazuo Yano et al.

It is certified that error appears in the above-indentified patent and that said Letters Patent is hereby corrected as shown below:

On the title page, under "[*] Notice": Change "Aug. 14, 2007" to -- Oct. 4, 2008 --.

Signed and Sealed this

Sixteenth Day of July, 1996

Attest:

BRUCE LEHMAN

Attesting Officer

Commissioner of Patents and Trademarks